United States Patent
Kimura et al.

[11] Patent Number: 6,075,471
[45] Date of Patent: Jun. 13, 2000

[54] ADAPTIVE CODING METHOD

[75] Inventors: Tomohiro Kimura; Fumitaka Ono; Ikuro Ueno; Taichi Yanagiya; Masayuki Yoshida, all of Tokyo, Japan

[73] Assignee: Mitsubishi Denki Kabushiki Kaisha, Tokyo, Japan

[21] Appl. No.: 09/041,134

[22] Filed: Mar. 12, 1998

[30] Foreign Application Priority Data

Mar. 14, 1997 [JP] Japan .................................. 9-060704

[51] Int. Cl.[7] .................................................. H03M 7/00
[52] U.S. Cl. ............................................. 341/107; 341/50
[58] Field of Search ............................... 341/107, 50, 51, 341/106; 358/261.2

[56] References Cited

U.S. PATENT DOCUMENTS

| | | | |
|---|---|---|---|
| 4,989,000 | 1/1991 | Chevion et al. | 341/107 |
| 5,059,976 | 10/1991 | Ono et al. | 341/107 |
| 5,307,062 | 4/1994 | Ono et al. | 341/107 |
| 5,357,250 | 10/1994 | Healey et al. | 341/107 |
| 5,404,140 | 4/1995 | Ono et al. | 341/107 |
| 5,587,710 | 12/1996 | Choo et al. | 341/107 |

*Primary Examiner*—Micheal Tokar
*Assistant Examiner*—Peguy JeanPierre

[57] ABSTRACT

An adaptive coding method is comprised of: a fourth step (508), (510) for calculating an occurrence frequency of either the more probable symbol (MPS) or the less probable symbol (LPS) with respective to the entered input; a fifth step (511) for comparing an occurrence time accumulated value calculated as the occurrence frequency at the fourth step with a preselected value (threshold value), and for reducing the occurrence time accumulated value by ½ in the case that the occurrence time accumulated value reaches the preselected value (threshold value); and a sixth step (513) for defining the more probable symbol (MPS) and the less probable symbol (LPS) in correspondence with a predetermined region on a numerical line with respect to the data signal to thereby output coordinate values on the numerical line as a corded word.

8 Claims, 31 Drawing Sheets

ADAPTIVE CODING METHOD

BACKGROUND OF THE INVENTION

1. Field of the Invention

The present invention generally relates to coding of a signal, and more specifically, to an adaptive coding method for estimating probability of entropy encoding.

2. Description of the Related Art

In entropy, arithmetic coding, and decoding, it is known in order to calculate entropy, such that probability estimate of a signal which should be encoded and thereafter should be decoded is required. In arithmetic coding (encoding) and decoding, large data can be compressed by the probability estimate with high precision. As a consequence, the probability estimate is preferably adapted to a change in symbol probability with a priority.

U.S. Pat. No. 5,025,258 discloses such a technique that the adaptive degrees of the symbols to be encoded and decoded to the estimated probability are optimized. This conventional technique will now be described more in detail with reference to FIG. 1 and FIG. 2.

FIG. 1 represents a block diagram for showing the prior art entropy encoder 101 in a simple manner. This entropy encoder 101 accepts the data symbols s(k), and encodes the data symbols S(K) thereof into the data stream a(i). Then, these data symbol S(K) are transferred via a transfer medium 102 to the remotely located entropy decoder 103. To acquire the receiver data stream, the entropy decoder 103 decodes these data symbols S(K) via the transfer medium as a replica of the transferred symbol s(k). The symbol s(k) contains elements (0, - - - , s–1), namely:

$$S(K)\epsilon(0, ---, s-1) \quad (1)$$

As explained above, the symbol is given as either a desirable multi-value or a desirable binary value.

As a result, in this example, the encoder 101 includes the arithmetic encoder unit 104, the context extractor 105, the adaptive probability estimator 106, and the line interface 107. Both the symbol s(k) and the probability estimate p(k) are supplied to the arithmetic encoder unit 104 so as to produce the encoded data stream a(i) by executing therein the well known method. Such an arithmetic encoder unit is well known in this technical field. This arithmetic encoder unit is apparently known from, for instance, "Compression of Black-White Image with Arithmetic Coding", IEEE Transaction on Communications VOL. cos-29, pages 858 to 867 issued in June, 1981; "ARITHMETIC ENCODER/DECODER FOR ENCODING/DECODING SYMBOL WITH BINARY ELEMENT" entitled in U.S. Pat. No. 4,633,490 issued on Dec. 30, 1986; and furthermore "Arithmetic Coding for Data Compression", Communications of the ACM, VOL.30, No. 6, pages 520 to 540, issued in June, 1987, which is related to the arithmetic encoder/decoder for encoding/decoding the symbol having the multi-value element. The line interface 107 interfaces the encoded data stream a(i) to transfer this encoded data stream a(i) to the transfer medium 102. This transfer medium 102 sequentially supplies the data stream a(i) to the remotely located decoder 103. As a consequence, the line interface 107 includes such a proper apparatus capable of formatting the data stream into the signal format used in the transfer medium 102. As the well known example of this possible transfer medium 102, there are a T-transfer trunk, an ISDN based subscriber line, and a local area network (LAN). Such a line interface is also well known in this technical field.

The context extractor 105 extracts the context of the received symbol s(k), namely, in this case:

$$C(K)\epsilon(0, ---, c-1) \quad (2)$$

In other words, the context extractor 105 produces the context (namely, condition) specific to such a symbol s(k) formed based upon the previously supplied symbol. For example, in an image compression system, the symbol s(k) indicates a color of a present pixel to be encoded, and a context c(k) is determined based on a color of the previous pixel, as explained before. For instance, both a color of a pixel (P) which is located adjacent to the present pixel on the same line and appears immediately before, and a color of a preceding pixel (A) appearing on a line located immediately before the line of the present pixel are employed so as to form a context c(k) for the symbol s(k) adapted to the binary value. In this manner, if both the pixel P and the pixel A are white, then the context c(k) is equal to 0. If both the pixel P and the pixel A are black, then the context c(k) is equal to 1. When the pixel P is black and also the pixel A is white, the context c(k) is equal to 2. When both the pixel P and the pixel A are black, the context c(k) is equal to 3. U.S. Pat. No. 4,633,490 discloses another context extractor (condition producer) with using the binary notation. As apparently from the foregoing descriptions, any ordinarily skilled engineers could extend such a binary-notation context extractor in order to obtain a context to which a multi-value has been applied. The context c(k) which is extracted and expressed is supplied to the adaptive probability estimator 106.

The adaptive probability estimator 106 is employed so as to produce a probability predicted value with respect to an input signal and a relevant context:

The input signal is given as follows:

$$S(K)\epsilon(0, ---, s-1) \quad (3)$$

The relevant context is given as follows:

$$C(K)\epsilon(0, ---, c-1) \quad (4)$$

The probability predicted value is given as follows:

$$P(K)= \quad (5)$$

As a consequence, the adaptive probability estimator 106 holds, or saves an array $(n_{s,c})$ having dimensions "S" and "C" at a final stage. In this case, the respective elements "$n_{s,c}$" of this array are an accumulation of occurrences of the symbol "s", namely "count" in the context "c", and the symbols "s" and "c" are dummy indexes for discriminating a location of "$n_{s,c}$" in the array. The adaptive probability estimator 106 may be readily realized by properly programming either a computer or a digital signal processor. However, it is conceivable that this adaptive probability estimator 106 may be formed as a semiconductor chip VLSI circuit in view of the better packaging mode.

A flow chart shown in FIG. 2 represents operations of the adaptive probability estimator 106 in which the adaptive speed of the symbol to be encoded with respect to the estimated probability is optimized to thereby produce the probability predicted value in high precision. The operation of the adaptive probability estimator 106 is commenced from a starting step 201. Next, at an operation block 202, the counts of "$n_{s,c}$" are initialized with respect to k=0, and all of values as follows:

$$n_{s,c} = N_{s,c} \quad (6)$$

$$s \in (0, \text{---}, s-1) \quad (7)$$

$$c \in (0, \text{---}, c-1) \quad (8)$$

It should be understood that symbol "$N_{s,c}$" is equal to a certain preselected value. At an operation block 203, a next context c(k) is obtained. It should be noted fact that the new context is identical to the previously obtained context. Next, at an operation block 204, a total value of the counts is obtained as 2 for the context c(k) acquired with respect to all of the following values:

$$s \in (0, \text{---}, s-1) \quad (9)$$

In other words, it is obtained as follows:

$$Z = \quad (10)$$

At an operation block 205, the adaptive probability estimator 106 (FIG. 1) outputs the probability predicted values which are sequentially supplied to the arithmetic encoder unit 104 (FIG. 1). Since this probability predicted value is obtained by the first execution, this probability predicted value is calculated based upon only the initial condition and the acquired context c(k). In the subsequent execution, the probability predicted value is calculated based on a total value of counting the occurrences of the symbol s(k) for the context c(k), namely an accumulated value. At a step 205, the probability predicted value is outputted in this manner. That is to say:

$$P_0(k) = \quad (11)$$

$$P_{s-1}(k) = \quad (12)$$

At an operation block 206, a symbol s(k) to be encoded is obtained. At an operation block 207, the count value for the obtained symbol s(k) and the context c(k) is incremented by 1. In other words:

$$n_{s(k), c(k)} \quad (13)$$

which are incremented by 1.

At an operation block 208, at least a first characteristic of a set of defined parameters, and at least a second characteristic are obtained. Each element of the set of the defined parameters is an accumulation corresponding to a context of a reception signal to be encoded, namely a function of a count. In other words, a predetermined set of parameters is equal to an occurrence time in which the occurrence of the symbol s(k) with respect to the context c(k) is "accumulated", namely n0,c(k), - - - , ns-1,c(k). In this example, at least the first characteristic corresponds to a minimum value of the accumulated occurrence times with respect to the context c(k). Namely, this minimum value is given as follows:

$$\text{MIN} = \text{MINIMUM}\{n,c(k), \ldots ns-1, c(k)\} \quad (14)$$

In this example, at least the second characteristic corresponds to a maximum value of the accumulated occurrence times with regard to the context c(k), namely, this maximum value is given as follows:

$$\text{MAX} = \text{MAXIMUM}\{n,c(k), \ldots n-1, c(k)\} \quad (15)$$

At a condition branching point 209, a test is done as to whether at least the first characteristic is equal to, or greater than at least a first threshold value, namely $$\text{MIN} \geq T1 \quad (16)$$

Otherwise, a test is made as to whether at least the second characteristic is equal to, or larger than at least a second threshold value, namely $$\text{MAX} \geq T2 \quad (17)$$

When at least the first characteristic (MIN) is used, it is important such that the adaptive degree of the adaptive probability estimator 106 (FIG. 1) can be optimized. In this example, the adaptive degree may be optimized by using at least the first characteristic equal to the above-described minimum value MIN, and the smaller threshold value T1 equal to 8. In this manner, in the prior art, the possible signals for the context c(k), namely (0, - - - , s-1) must be produced at least 8 times in order to satisfy the following conditions:

$$\text{MIN} \geq T1 \quad (18)$$

As a result, the use of at least the first characteristic MIN and at least the first threshold value T1=8 produces such an adaptive speed ideally adapted to the actually evaluated probability value. In order not to interpret that the range in this example is limited, if the application of the binary notation and the probability evaluated as 1/2 are employed as an example, then the accumulated production is adjusted after referring to the context c(k) substantially below-mentioned times:

$$8+8=16 \quad (19)$$

With respect to the probability evaluated as 1/4, the accumulated production is adjusted after referring to the context c(k) substantially below-mentioned times:

$$8+24=32 \quad (20)$$

With respect to the probability evaluated as 1/8, the accumulated production is adjusted after referring to the context c(k) substantially below-mentioned times:

$$8+56=64 \quad (21)$$

In this manner, the adaptive speed becomes fast with respect to the larger (not small) probability value than one as being evaluated whereas the adaptive speed necessarily becomes slow with respect to the smaller probability value than one as being evaluated. The adjustments of the adaptive speed are apparent from a step 209 and a step 210.

At least second characteristic corresponding to the maximum value MAX in this example is employed so as to avoid the overflow occurred in the accumulation of the occurrence of the symbol s(k) contained in the context c(k) in relation to at least the second threshold value T2. If the probability under evaluation is not equal to an excessively small value, then MAX does not constitute such a characteristic which requires the parameter adjustment. As a typical example, the value of the threshold value T2 is 2048. This example implies that another characteristic of a set of parameters is utilized. For instance, a total "Z" obtained at the step 204 is employed instead of MAX.

In this manner, when any one of the below-mentioned condition formula (22) and the following formula (23) can be satisfied, the process operation is returned to the step 209: the condition formula (22) is expressed by:

$$\text{MIN} \geq T1 \quad (22)$$

Also, the formula (23) is expressed by:

$$MAX \geq T_2 \qquad (23)$$

At an operation block 210, the symbol element accumulated in the context c(k) is adjusted. The adjustment of the adaptive speed is realized at a step 210 in relation to the step 209 which constitutes the cause of the adjustment. For example, the accumulation displayed, namely the count is determined by a so-called "half reduction" set by the following formula (25) about the accumulated occurrence for the context c(k) with respect to all of:

$$S \in (0, ---, s-1) \qquad (24)$$

The formula (25) is expressed by:

$$n_{s,c}(k) = (n_{s,c}(k)+1)/2 \qquad (25)$$

Conventionally, when the condition of either the formula MIN $T_1$ or the formula MAX $T_2$ can be satisfied, the count is adjusted by the same method. As to a certain sort of application, it is convenient to separately adjust each of the above-described conditions. When the count is once adjusted, it should be noted that this adjusted count displays the accumulated occurrence. The adjustment of this accumulated occurrence makes the probability estimate more depend on the newer occurrence in the context c(k). As previously described, the accumulated occurrence produced in accordance with the formula MIN $T_1$ is adjusted, so that the adaptive degree can be ideally made coincident with the actual probability under evaluation. The adjustment of the accumulated occurrence of the symbol s(k) contained in the context c(k) produced in response to the formula MAX $T_2$ is to protect the possible arithmetic overflow condition under such a rare case that a very small probability value is estimated.

Thereafter, at a condition branching point 211, a test is made as to whether or not the symbol s(k) corresponds to a final symbol to be encoded/decoded. Normally, the number of symbols to be encoded is known. If this number is conversely not known, then the indication of the number of symbols is supplied to the adaptive probability estimator 106. When the test result is "YES" at the condition branching point 211, the operation of the element of the adaptive probability estimator 106 is accomplished via an END step 212. Conversely, when the test result is "NO" at the condition branching step 211, the control operation is returned to the step 203. Then, the proper operation is repeatedly performed from the step 203 to the step 211 until the test result at the step 211 becomes "YES".

Returning back to the step 209, if the test result becomes "NO", then the control operation is advanced to the step 211 at which the test is made as to whether or not the symbol s(k) corresponds to the final symbol to be encoded (or decoded). If the test result becomes "YES" at the step 211, then the operation of the element of the adaptive probability estimator 106 is accomplished via the END step 212. Conversely, when the test result becomes "NO" at the step 211, an index "k" is produced by being incremented by 1 at a step 213, and the control operation is returned to the step 203. The proper operation is repeatedly performed from the step 203 to the step 211 until the test result becomes "YES" at the step 211.

In the prior art, the decoder 103 includes the line interface 108, the arithmetic decoder unit 109, the context extractor 110, and the adaptive probability estimator 111. The line interface 108 executes the reverse function with respect to the function owned by the line interface 107, so that the input signal is deformatted by the known method so as to acquire the data stream s(i). The arithmetic decoder unit 109 executes the reverse function with regard to the function owned by the arithmetic decoder unit 104. As a consequence, both the received data stream a(i) and the probability estimate derived from the adaptive probability estimator 111 are supplied to the arithmetic decoder unit 109 so as to be used by executing the known method for acquiring the symbol s(k). Such an arithmetic decoder unit is well known in this technical field. This well known coding technique is described in the previous citations, i.e., "Compression of Black-White Image with Arithmetic Coding" IEEE, Transaction on Communications; "Arithmetic Encoder/Decoder for encoding/decoding symbol having binary value" (U.S. Pat. No. 4,633,490); and also "Arithmetic Coding for Data Compression applied to multi-value", Communications of the ACM. Since the structure/operation of the context extractor 110 are identical to those of the context extractor 105, explanations thereof are omitted. Similarly, since the structure/operation of the adaptive probability estimator 104 are identical to those of the adaptive probability estimator 111, explanations thereof are omitted.

In the conventional probability estimating method for the non-storage information source data, since the count value of the counter is reduced by ½ without any restriction in order to avoid the overflow of the counter when the count value becomes the maximum value, the estimated probability error is increased. Thus, there is a problem that the coding efficiency is deteriorated.

SUMMARY OF THE INVENTION

The present invention has been made to solve the above-described problem, and therefore, has an object to provide such a coding method capable of reducing an estimated probability error and of increasing a coding efficiency.

An adaptive coding method, according to a first invention, is featured by comprising:

a first step (502) for entering data to be coded so as to calculate occurrence probability of a symbol with respect to this entered data;

a second step (504) for judging as to whether the symbol with respect to the entered data is equal to a more probable symbol (MPS), or a less probable symbol (LPS);

a third step (505), (509) for calculating a region on a numerical line, which corresponds to the entered data, based upon the judgment result of the second step (504);

a fourth step (508), (510) for calculating an occurrence frequency of either the more probable symbol (MPS) or the less probable symbol (LPS) with respective to the entered input;

a fifth step (511) for comparing an occurrence time accumulated value calculated as the occurrence frequency at the fourth step with a preselected value (threshold value), and for reducing the occurrence time accumulated value by ½ in the case that the occurrence time accumulated value reaches the preselected value (threshold value); and a sixth step (513) for defining the more probable symbol (MPS) and the less probable symbol (LPS) in correspondence with a predetermined region on a numerical line with respect to the data signal to thereby output coordinate values on the numerical line as a corded word.

In an adaptive coding method according to a second invention, at the fourth step, as an occurrence frequency (N LPS) of the less probable symbol (LPS) and an occurrence frequency (N MPS) of the more probable symbol (MPS), an occurrence time accumulated value is calculated, and as a total value (N TOTAL) of the occurrence frequencies of the less probable symbol (LPS) and of the more probable symbol (MPS), another occurrence time accumulated value is calculated; and at the first step, occurrence probability of symbols is obtained by calculating the occurrence time accumulated value (N LPS, N TOTAL).

In an adaptive coding method according to a third invention, at the fourth step, as an occurrence frequency (N LPS) of the less probable symbol (LPS) and an occurrence frequency (N MPS) of the more probable symbol (MPS), an occurrence time accumulated value is calculated; and at the first step, occurrence probability of symbols is obtained by calculating the occurrence time accumulated value (N LPS, N TOTAL).

In an adaptive coding method according to a fourth invention, the fourth step is provided between the first step and the second step.

In an adaptive coding method according to a fifth invention, in the case that the N MPS value of the more probable symbol (MPS) is smaller than T2 in the calculation of the occurrence frequency of the more probable symbol (MPS) at the fourth step, the calculation of the occurrence frequency of the more probable symbol (MPS) is carried out.

In an adaptive coding method according to a sixth invention, as to reducing the occurrence frequency of either the more probable symbol (MPS) or the less probable symbol (LPS) by ½ at the fifth step, in such a case that the N MPS value of the more probable symbol (MPS) is larger than, or equal to T2 and also the N LPS value is larger than 1, the occurrence frequency of either the more probable symbol (MPS) or the less probable symbol (LPS) is reduced by ½.

In an adaptive coding method according to a seventh invention, in the case that the N MPS value of the more probable symbol (MPS) is smaller than T3, or the N MPS value of the more probable symbol (MPS) is smaller than T2 and also the N LPS value of the less probable symbol (LPS) is smaller than T4 in the calculation of the occurrence frequency of the more probable symbol (MPS) at the fourth step, the calculation of the occurrence frequency of the more probable symbol (MPS) is carried out.

In an adaptive coding method according to an eighth invention, in such a case that the N MPS value of the more probable symbol (MPS) is larger than, or equal to T3 and smaller than T2 as well as the N LPS of the less probable symbol (LPS) is larger than, or equal to T4, otherwise, the N MPS value of the more probable symbol (MPS) is larger than, or equal to T2 as well as the N LPS value of the less probable symbol (LPS) is larger than 1 in the ½ reduction of the occurrence frequency of either the more probable symbol (MPS) or the less probable symbol (LPS) at the fifth step, the ½ reduction process of the occurrence frequency of either the more probable symbol (MPS) or the less probable symbol (LPS) is carried out.

DETAILED DESCRIPTION OF THE PREFERRED EMBODIMENTS

Now, a description will be given in more detail of preferred embodiments of the present invention with reference to the accompanying drawings.

EMBODIMENT 1

As an example of a coding method according to embodiment 1, a coding process operation when arithmetic coding is applied is represented as an entropy coding device with respect to binary data.

It should be noted that a region of a more probable symbol (MPS) is arranged downward, and a code is coded as a lower field value coordinate of an effective region. At this time, calculation precision is established by that the calculation is stopped at binary decimal 16 bits, and an integer portion is code-outputted.

Figure 1:
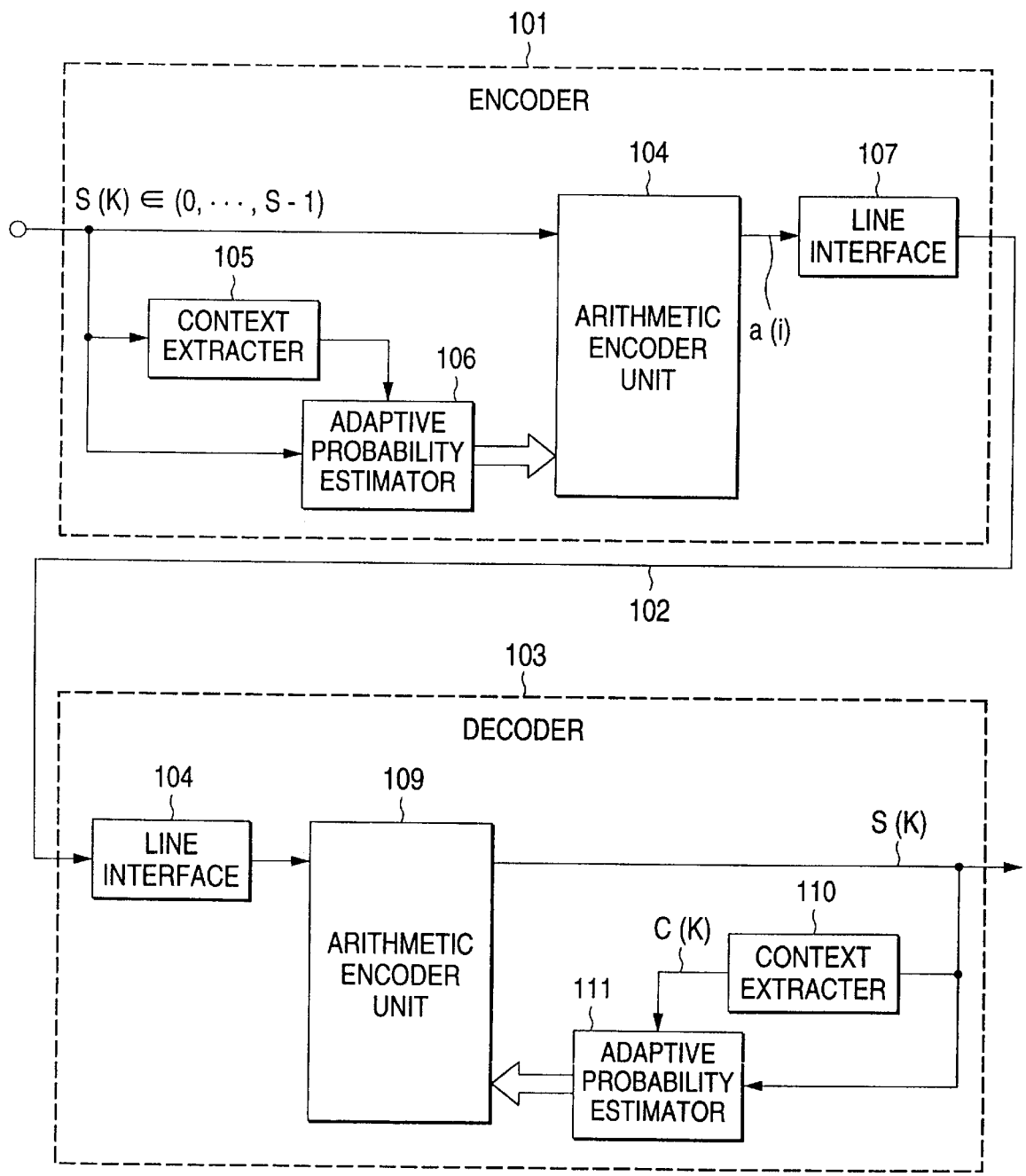
FIG. 1 is a diagram for showing the arrangement of the prior art coding/decoding apparatus.
Figure 2:
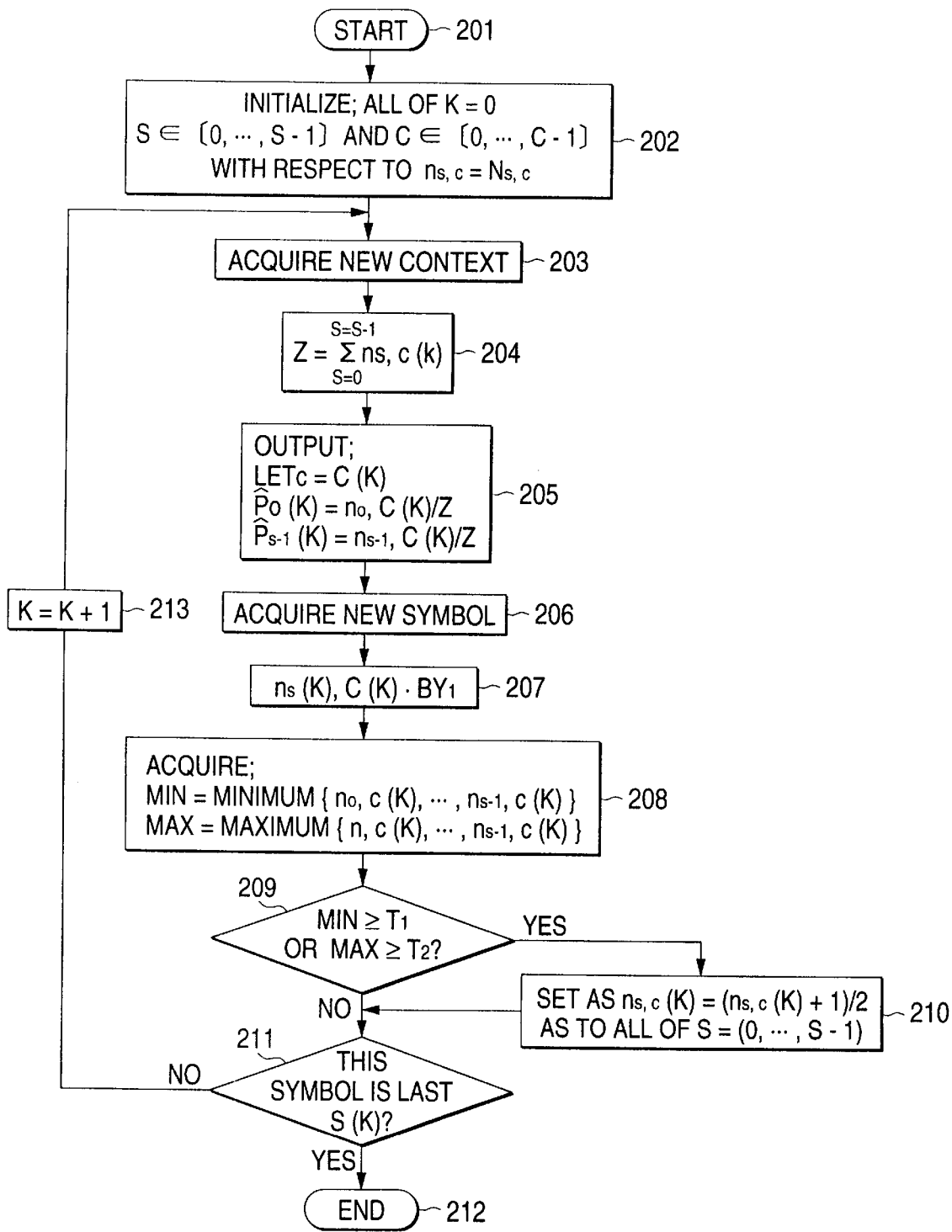
FIG. 2 is a flow chart for describing the process operation of the prior art adaptive probability estimator.

Also, in embodiment 1, a description is made of the process operations about the adaptive probability estimator 106 and the arithmetic encoder unit 104 of the prior art shown in FIG. 1. Since it is well known that the circuit arrangements other than the encoder of FIG. 1 are also employed in this embodiment, descriptions thereof are omitted. It should also be noted that the circuit arrangements other than the encoder of FIG. 1 are similarly employed in other embodiments.

Variables employed in the below-mentioned descriptions are defined as follows:

That is, a variable "C" shows a code value; a variable "A" represents a region width value; a variable "AL" indicates an LPS region width value; a variable "MPS" denotes a more probable symbol (MPS) value; a variable "LPS" is a less probable symbol (LPS) value (1–MPS); and a variable "S" indicates a data value. A variable "N0" indicates an occurrence frequency of data 0 (counter); a variable "N1" represents an occurrence frequency of data 1 (counter); a variable "N LPS" shows min (N0, N1) (corresponding to MIN); a variable "N MPS" denotes max (N0, N1) (corresponding to MAX); a variable "P" indicates occurrence probability of a less probable symbol (LPS); and a variable "LEN" denotes a code length (binary bit number).

It should be understood that the variable N MPS corresponds to the variable MAX of the prior art and the variable N LPS corresponds to the variable MIN of the prior art in the following description of the coding process sequential operation. When the more probable symbol (MPS) value MPS is equal to 0, the variable N MPS corresponds to N0, whereas when the more probable symbol (MPS) value is equal to 1, the variable N MPS corresponds to N1. When the more probable symbol (MPS) value MPS is equal to 0, the variable N LPS corresponds to N1, whereas when the more probable symbol (MPS) value is equal to 1, the variable N LPS corresponds to N0.

Furthermore, constants employed in the process sequential operation are given as follows:

A constant "T1" indicates a maximum count value (first threshold value) of the variable N LPS.

A constant "T2" represents a maximum count value (second threshold value) of the variable N MPS.

The coding process sequential operations according to embodiment 1 are explained in the following FIG. 4, FIG. 5, FIG. 6, FIG. 7, and FIG. 8.

Figure 4:
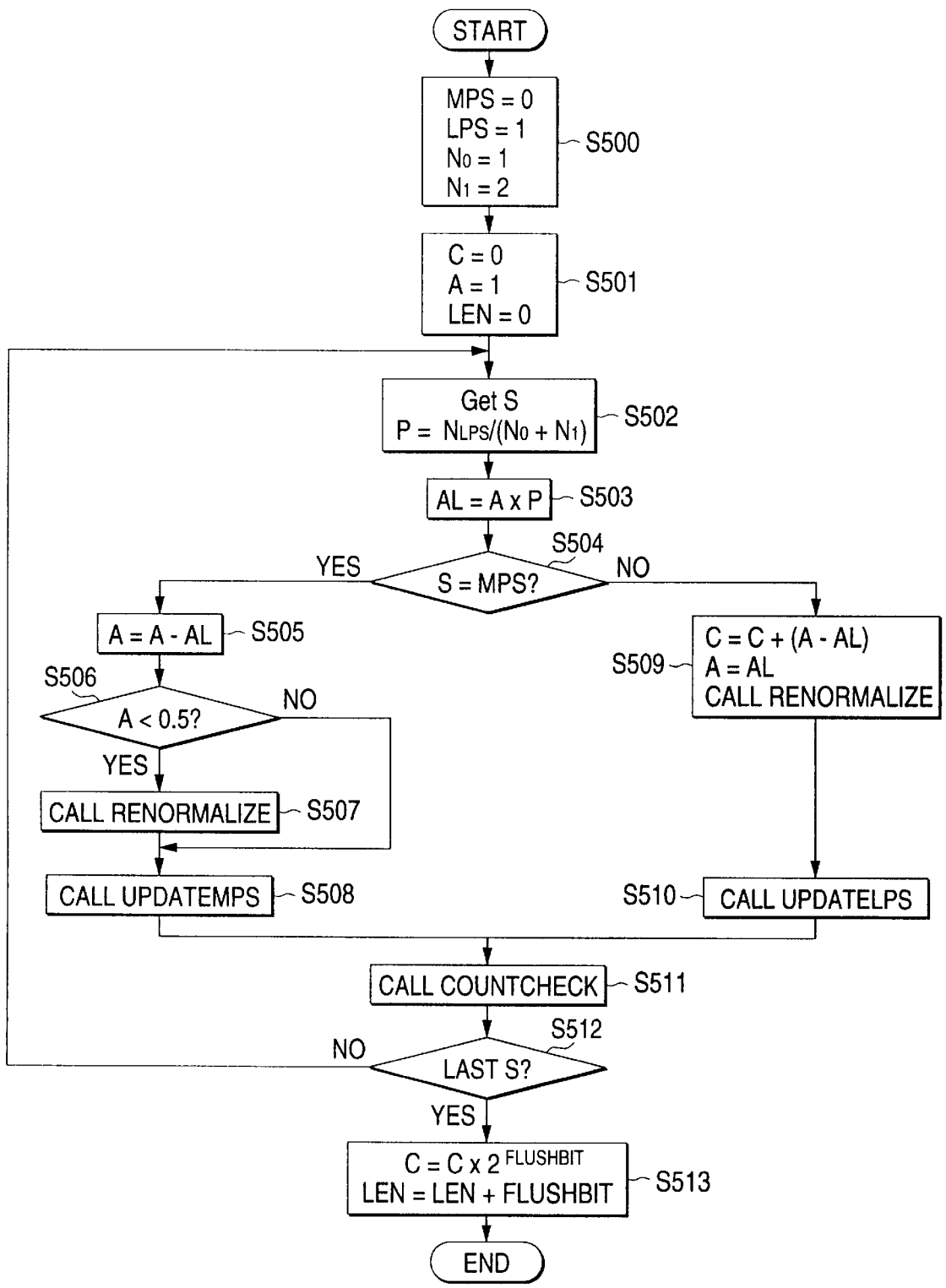
FIG. 4 is a flow chart for describing a coding process of the first embodiment.

FIG. 4 is a flow chart for describing a process sequential operation of arithmetic coding of binary data based upon process operations by the adaptive probability estimator 106 and the arithmetic encoder unit 104 shown in FIG. 1. In this flow chart, at a step S500, a calculation is made of the more probable symbol (MPS) value MPS, the less probable symbol (LPS) value LPS, and the occurrence frequencies N0, N1 of the data 0, 1. At a step S501, the code value C, the region width A, and the code length LEN are initialized. At a step S502, the data value S is obtained, and thus the occurrence probability P of the less probable symbol (LPS) is calculated as N LPS/(N0+N1). At a step S503, the occurrence probability P of the less probable symbol (LPS) is multiplied by the entire region width value A to thereby calculate the region width value AL corresponding to the less probable symbol (LPS). At a step S504, a judgment is made as to whether or not the data value S is equal to the more probable symbol (MPS). When the judgment result is YES at the step S504, the region width value A is updated by another region width value (A–AL) corresponding to the more probable symbol (MPS), but the code value C is not updated, because the more probable symbol (MPS) is arranged in a lower portion at a step S505. At a step S506, if the updated region width value A is smaller than 0.5, then the normalizing process operation is carried out in such a manner that both the region width value A and the code value C are multiplied by an exponent of 2 until this region width value A becomes larger than, or equal to 0.5 by calling RENORMAL of a step S507.

At a step S508, the occurrence frequency of the more probable symbol (MPS) value is counted by calling UPDATEMPS. When the judgment result becomes N0 at the step S504, the normalizing process operation is carried out at a step 508 in such a manner that the region width value (A–AL) corresponding to the lower more probable symbol (MPS) is added to the code value C equal to the region lower limit value, the region width value A is updated by the region width value AL corresponding to the less probable symbol (LPS), and both the region width value A and the code value C are multiplied by an exponent of 2 until the region width value A becomes larger than, or equal to 0.5 by calling RENORMALIZE, because at this time, the region width value A necessarily becomes smaller than 0.5. At a step S510, the occurrence frequency of the less probable symbol (LPS) value is counted by calling UPDATELPS. At a step S511, in such a case that the count value of the occurrence frequency updated at the steps S508 and S510 by calling COUNTCHECK becomes larger than a constant, both the occurrence frequency (counter value) of the data 0 and the occurrence frequency (counter value) of the data 1 are reduced by ½ at the same time.

Now, in this case, as to the counter in, for example, an UPDATEL process (otherwise UPDATEM process), when the value of the constant T1 (or T2) equal to the maximum count value is the m-th power of 2, in order to realize by a binary counter with m digits, generally speaking, if the m-th power of 2 is expressed in the counter with m digits, then the overflow will occur and thus the count value becomes 0. There is no contradictory case that since the occurrence frequency 0 could not be realized, it is handled as the m-th power of 2 during the probability estimating calculation (step S502). Alternatively, the counter continuously may count the occurrence frequencies smaller than the actual occurrence frequencies by 1 (initial value being 0), and 1 may be added to the respective count values during the probability estimating calculation (step S502). In any cases, in the ½ reduction process, as to the counter with the overflowed digit, the count value must be updated as T1/2 (or T2/2). It should be noted that if there is no problem even when the counter overflows, the ½ reduction process operation may be carried out in the conventional manner.

At a step 512, a check is done as to whether or not the processed data S is the last data. If the processed data S is not the last data, then the process operation defined from the step S502 to the step 511 is repeatedly performed. At a step 513, a post process operation of the coding operation is performed. That is, 16 bits of a decimal portion (precision FLUSHBIT=16) of the code value C are multiplied by the 16-th power of 2, and then the multiplied 16 bits are outputted to the integer portion. This "16" is added to the code length LEN to produce a total code length. In summary, when the digital signal (data signal) is coded, both the more probable symbol (MPS) equal to such a symbol having high occurrence probability, and also the less probable symbol (LPS) equal to such a symbol having low occurrence probability are made in correspondence with a preselected range on a numerical straight line based upon a range $(A_{1-r})$ of the previous symbol on the numerical straight line, and a predetermined range (AL) of the less probable symbol (LPS) on the numerical straight line. Thereafter, the coordinate values of these symbols on the numerical straight line are outputted as the code word. It should be noted that the general content of this coding operation is described more in detail in Japanese Patent Publication No.8-34434 published in 1996.

Figure 5:
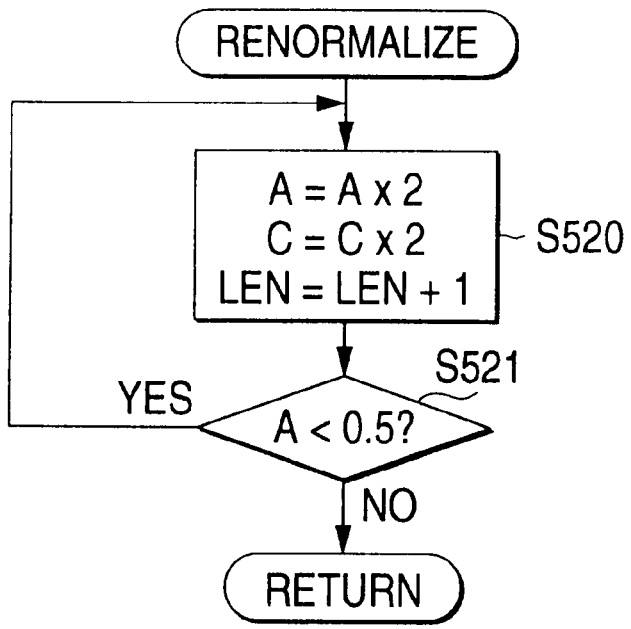
FIG. 5 is a flow chart for indicating a process operation of RENORMALIZE of the first embodiment.

FIG. 5 is a flow chart for describing a process sequential operation of the normalizing process RENORMALIZE of the arithmetic coding variable, in which an arithmetic code length (LEN) is counted from the operation times thereof at the same time. At a step S520, the region width value A and the code value C are multiplied by 2, and 1 is added to the code length LEN. At a step 521, when the region width value A is smaller than 0.5, the process operation defined at the step S520 is repeatedly executed until this region width value A becomes larger than, or equal to 0.5. In this case, 1 bit of the code is outputted from the decimal portion to the integer portion every time the region width value A and the code value C are multiplied by 2.

Figure 6:
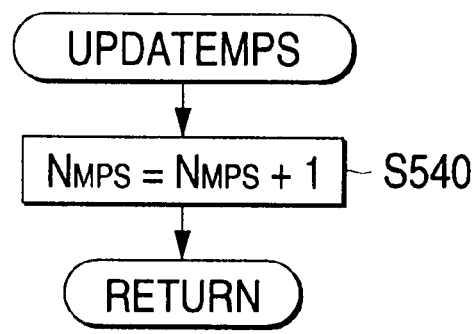
FIG. 6 is a flow chart for showing a process operation of UPDATEMPS of the first embodiment.

FIG. 6 is a flow chart for showing a process sequential operation of UPDATEMPS for counting the occurrence frequency of the more probable symbol (MPS). At a step S540, 1 is added to an occurrence frequency counter N MPS of a more probable symbol (MPS) value MPS.

Figure 7:
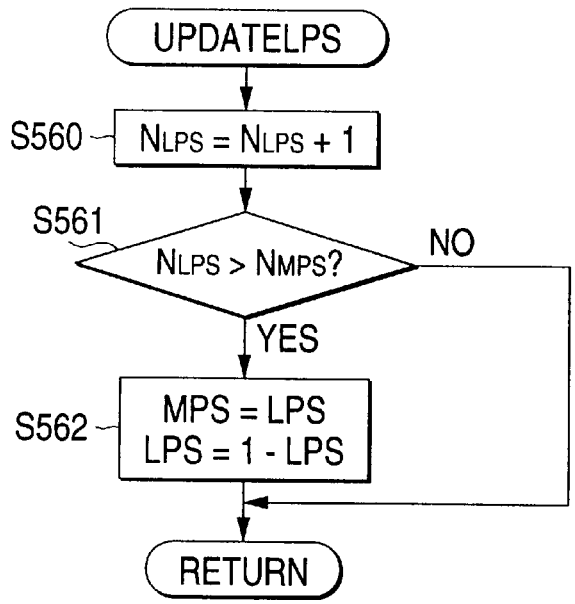
FIG. 7 is a flow chart for indicating a process operation of UPDATELPS of the first embodiment.

FIG. 7 is a flow chart for showing a process sequential operation of UPDATELPS for counting the occurrence frequency of the less probable symbol (LPS). At a step S560, 1 is added to an occurrence frequency counter N LPS of a less probable symbol (LPS) value LPS. At a step S561, if the occurrence frequency counter N LPS of the less probable symbol (LPS) is larger than the occurrence frequency N MPS of the more probable symbol (MPS), both the more probable symbol (MPS) value MPS and the less probable symbol (LPS) value LPS are inverted, namely replaced at a step S562.

Figure 8:
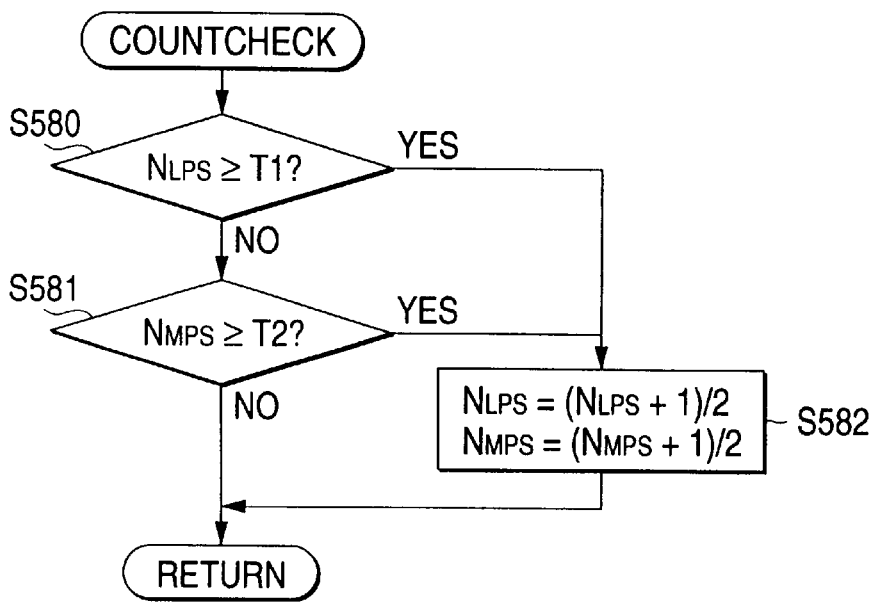
FIG. 8 is a flow chart for showing a process operation of COUNTCHECK of the first embodiment.

FIG. 8 is a flow chart for describing a process sequential operation of COUNTCHECK in which the count value is reduced by ½ when the count value of the updated occurrence frequency becomes larger than a predetermined value. At a step S580, a judgment is made as to whether or not the occurrence frequency N LPS of the less probable symbol (LPS) is larger than, or equal to the set value T1, otherwise whether or not the occurrence frequency N MPS of the more probable symbol (MPS) is larger than, or equal to the set value T2. At a step 582, such a ½-reduction process operation is carried out ion such a way that, for instance, 1 is added to the respective occurrence frequencies N LPS and N MPS of the less probable symbol (LPS) and the more probable symbol (MPS), and then the added occurrence frequencies are multiplied by ½. The reason why after 1 is added to the respective symbol occurrence frequencies, the added occurrence frequencies are multiplied by ½ is such that these occurrence frequencies are not equal to 0.

It should also be noted that the above-described process sequential operations are directed to the single context. Alternatively, a multi-context may be processed. When the multi-context is handled, at the step 502, the below-mentioned variables may be processed while the context CX is acquired at the same time with the data value, and the acquired context is used as an array (table) in which the context CX is employed as an index.

For instance, a variable MPS(CX) is used as a more probable symbol (MPS) value; a variable LPS(CX) is employed as a less probable symbol (LPS) value (1−MPS (CX)); a variable N0(CX) is used as an occurrence frequency (counter) of data 0; a variable N1(CX) is employed as an occurrence frequency (counter) of data 1; a variables N LPS (CX) is used as min (N0(CX), N1(CX)) (corresponding to first characteristic MIN); and a variable N MPS(CX) is employed as max (N0(CX), N1(CX)) (corresponding to second characteristic MAX).

Figure 3:
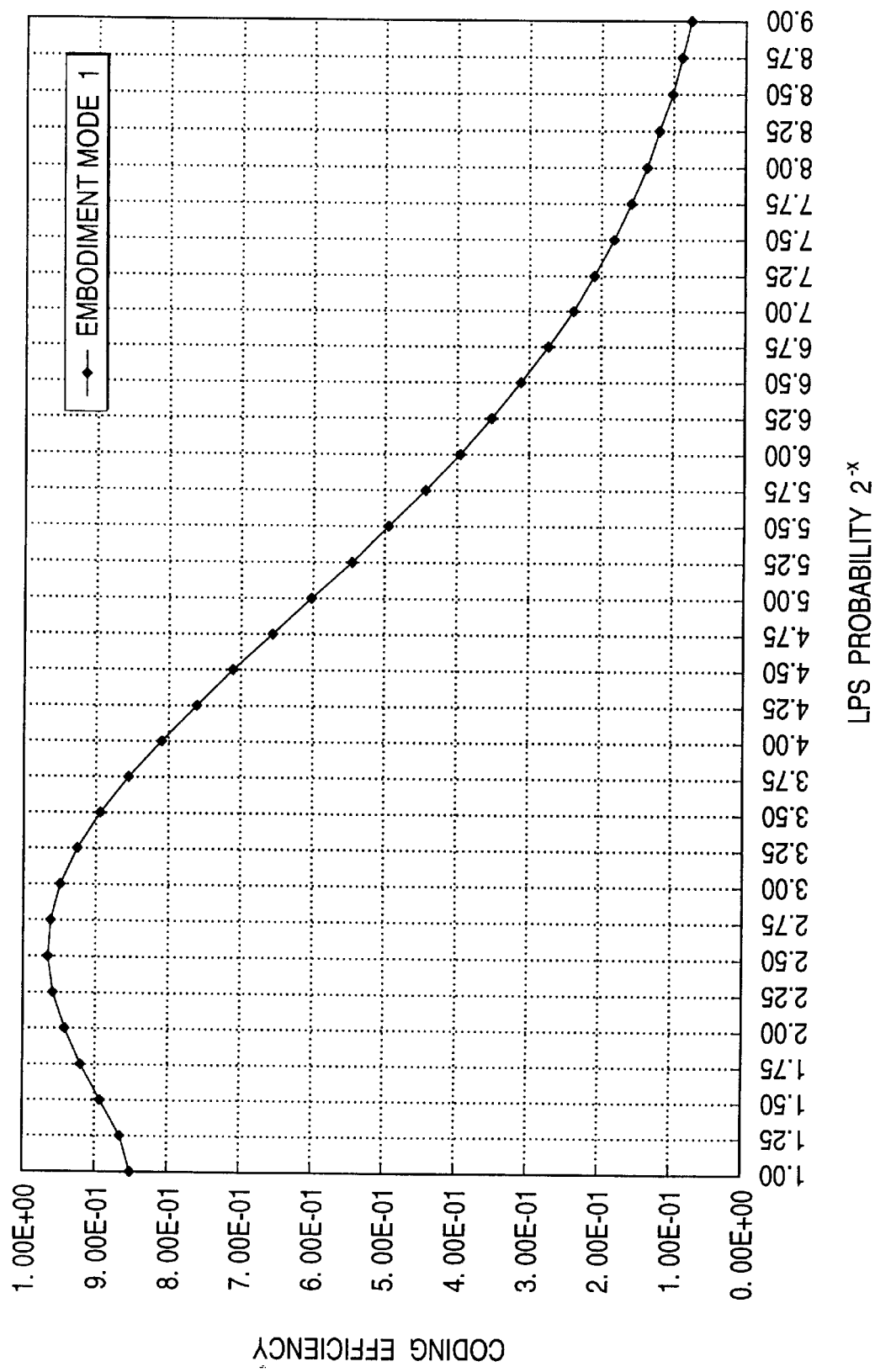
FIG. 3 is a graphic representation for showing a coding efficiency of a first embodiment of the present invention.

Then, assuming now that occurrence probability p0 of data is constant, a calculation was made of a coding efficiency E=H(p0)/LEN based on entropy H(p0) obtained from the set occurrence probability and also the code length LEN obtained from the simulation. Also, as the constant condition of the simulation, it is set by that T1=2 and T2=8. While the occurrence probability p0 of the data is changed and also the respective data lengths are selected to be 100000, the coding operation was carried out with the single context. The coding result is indicated in FIG. 3.

In the above description, the coding efficiency is calculated (see FIG. 3) by setting the variables (array in multi-context) to the more probable symbol (MPS) value MPS. Even when the occurrence frequencies are identical to each other, since the multiplication type arithmetic coding operation is executed, only the code length loss occurs, which is caused by the digit cancelling error due to such a fact that the fixed data value is allocated as the more probable symbol (MPS). It should be understood that although the more probable symbol (MPS) value is inverted at the step S562 of FIG. 7, it may be regarded that the more probable symbol (MPS) value is not used as the fixed data value, but is discriminated at the time when the occurrence frequencies are identical to each other. Also, even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto. Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts. Furthermore, this gives no adverse influence to the effect capable of essentially improving the probability estimating precision and the coding efficiency irrelevant to the correction process from the final code value to the minimum effective digit, and the removing process of the code bit 0 subsequent to the terminal. It should be noted in the embodiment 1 that preselected values may be used as the constants T1 and T2.

EMBODIMENT 2

Figure 9:
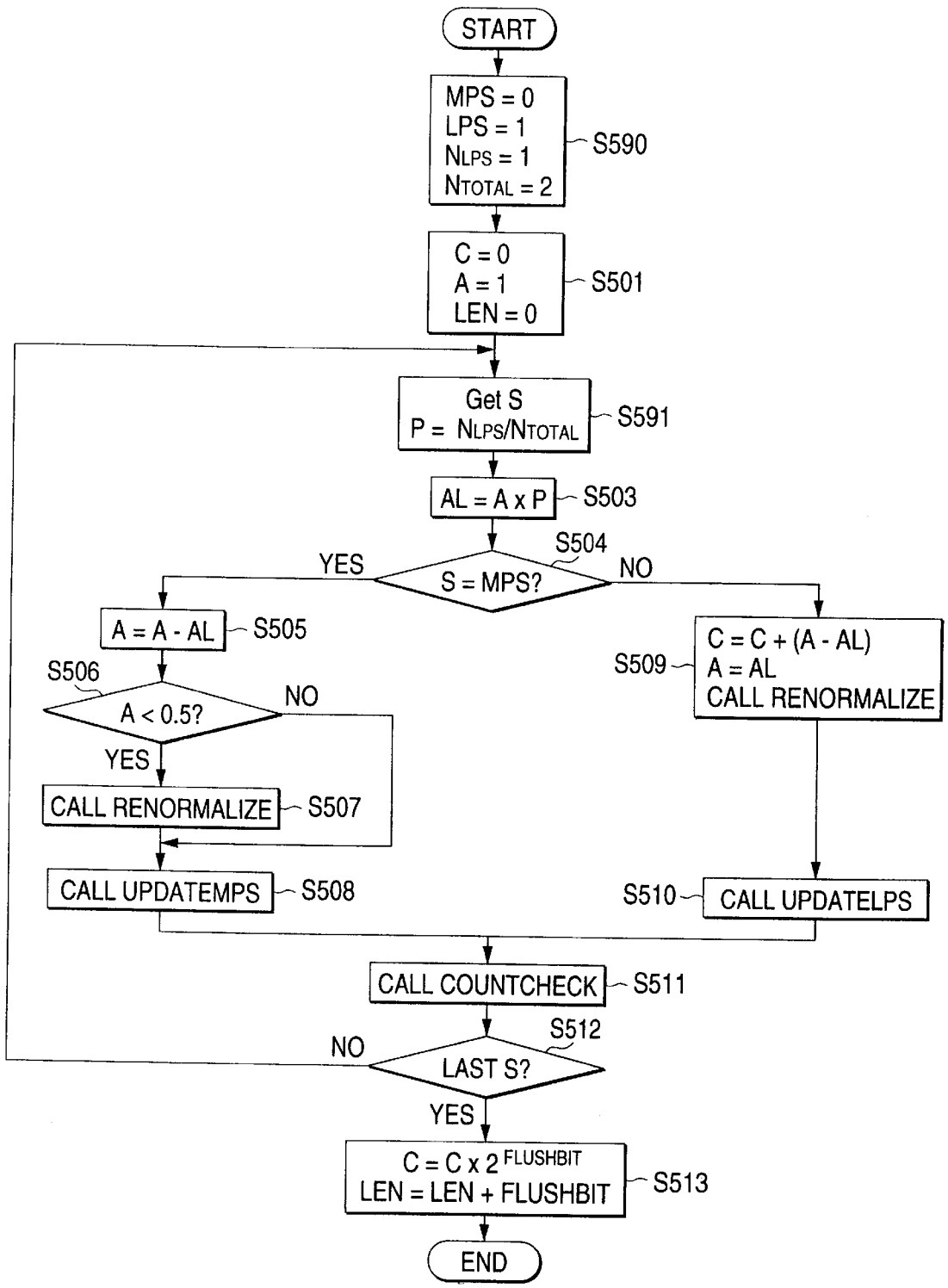
FIG. 9 is a flow chart for representing a coding process operation of a second embodiment of the present invention.

FIG. 9 is a flow chart for describing an arithmetic coding process sequential operation according to a second embodiment of the present invention. Since this coding process sequential operation is similar to that of the first embodiment shown in FIG. 4, only changed process operations will now be explained. At a step S590, a count value of an occurrence frequency counter as to the step 500 is set as the occurrence frequency N LPS of the less probable symbol (LPS), and a total N TOTAL of occurrence frequencies of the less probable symbol (LPS) and the more probable symbol (MPS), whereas initial values of N LPS and N TOTAL are 1, and 2, respectively. At a step S591, a denominator of such a calculation by which the probability P of the less probable symbol (LPS) is obtained from the occurrence frequency is set to N TOTAL from a summation between N MPS and N LPS.

Figure 10:
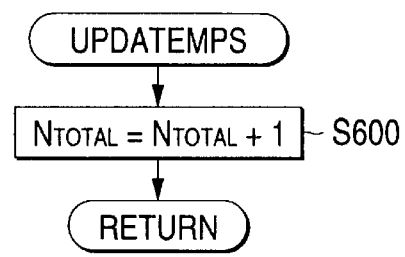
FIG. 10 is a flow chart for describing a process operation of UPDATEMPS of the second embodiment.

Since a flow chart shown in FIG. 10 is similar to that of FIG. 6, a description will now be made of only changed process sequential operations. At a step S600, a count value of the occurrence frequency counter N MPS for the more probable symbol (MPS) at the step 504 is set as a count value of a total T TOTAL made of the occurrence frequencies of the more probable symbol (MPS) and of the less probable symbol (LPS).

Figure 11:
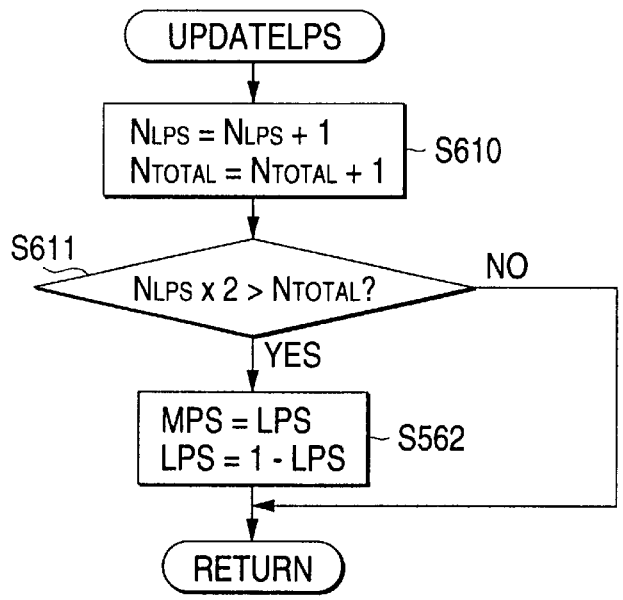
FIG. 11 is a flow chart for describing a process operation of UPDATELPS of the second embodiment.

Since a flow chart shown in FIG. 11 is similar to that of FIG. 7, a description will now be made of only changed process sequential operations. At a step S610 a counting process operation is newly added to count a count value of a total T TOTAL made of the occurrence frequencies of the more probable symbol (MPS) and of the less probable symbol (LPS) at the step S560. Also, at a step S611, a judgment is made as to whether or not two times of the occurrence frequency N LPS of the less probable symbol (LPS) are larger than a total N TOTAL of the occurrence frequencies for the less probable symbol (LPS) and the more probable symbol (MPS). In other words, a check is made as to whether or not the occurrence frequency N LPS exceeds a half value of the total N TOTAL. If N LPS exceeds N TOTAL, then the more probable symbol (MPS) value MPS and the less probable symbol (LPS) value LPS are inverted at a step S562.

Figure 12:
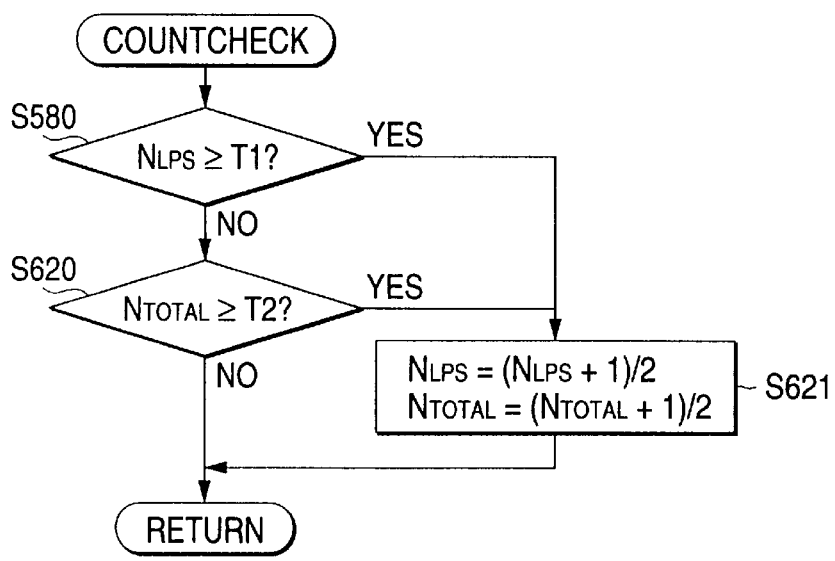
FIG. 12 is a flow chart for describing a process operation of COUNTCHECK of the second embodiment.

Since a flow chart shown in FIG. 12 is similar to that of FIG. 8, a description will now be made of only changed process sequential operations. At a step S620 and a step S621, a judging operation (S620) and a counting operation (S621) are performed based on a count value of the occurrence frequency counter N MPS for the more probable symbol (MPS) at the steps 581 and 582 to a count value of a total N TOTAL made of the occurrence frequencies of the more probable symbol (MPS) and of the less probable symbol (LPS).

Figure 13:
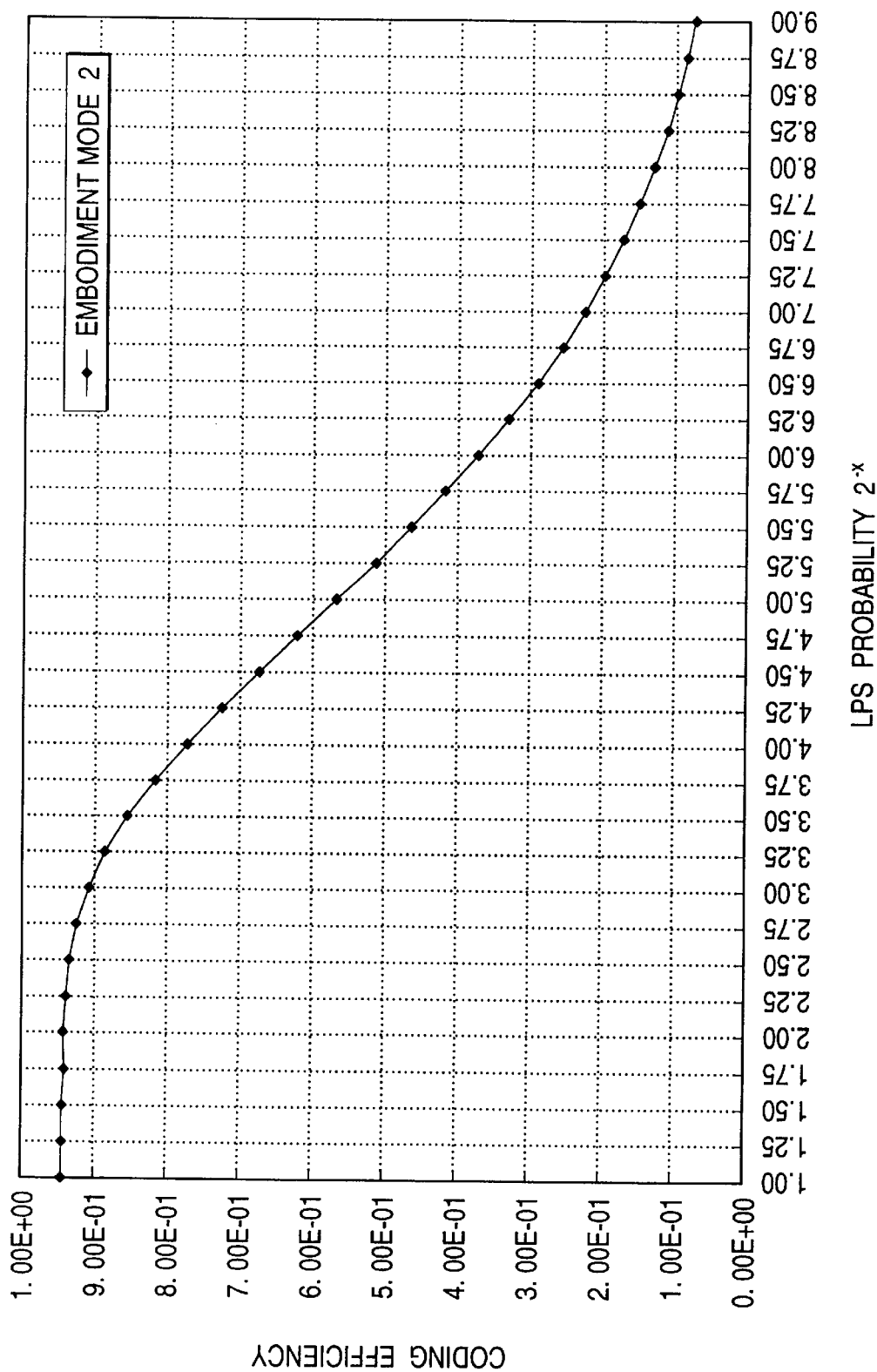
FIG. 13 is a graphic representation for showing a coding efficiency of the second embodiment.

Similar to embodiment 1, in accordance with embodiment 2, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, it is set T1=2 and T2=8. While the occurrence frequency p0 of the data is varied, the respective data lengths are set to 100000. Then, the coding process operation was carried out by a single context. The coding results are indicated in FIG. 13.

As previously described, in accordance with the above-explained embodiment 1 and embodiment 2, the arithmetic coding process operation is applied to the entropy coding device, and the minimum process operation required to calculate the code length thereof is carried out. In the drawings, the process operation by the arithmetic coding unit is defined by the steps S501, S503, S505 to S507, and S509. Such a fact that the probability estimator can be separated from the arithmetic coding unit implies that the arithmetic coding unit as previously explained as one example can be replaced by another entropy coding unit. This fact may be similarly interpreted in all of the below-mentioned embodiments. Also, as the entire process flow, such an explanation will be made of such a case that the arithmetic coding is applied so as to calculate the code length for the performance evaluation since only the information is used which can be commonly referred to the decoding operation, the probability predicted value during the decoding operation can be completely reproduced.

EMBODIMENT 3

Similar to embodiment 1 and embodiment 2, there is shown a coding process sequential operation according to embodiment 3 of the present invention when the arithmetic coding operation is applied to the binary data. It should be understood that variables and constants employed in this coding process sequential operation are similar to those used in embodiment 1 and 2.

Figure 14:
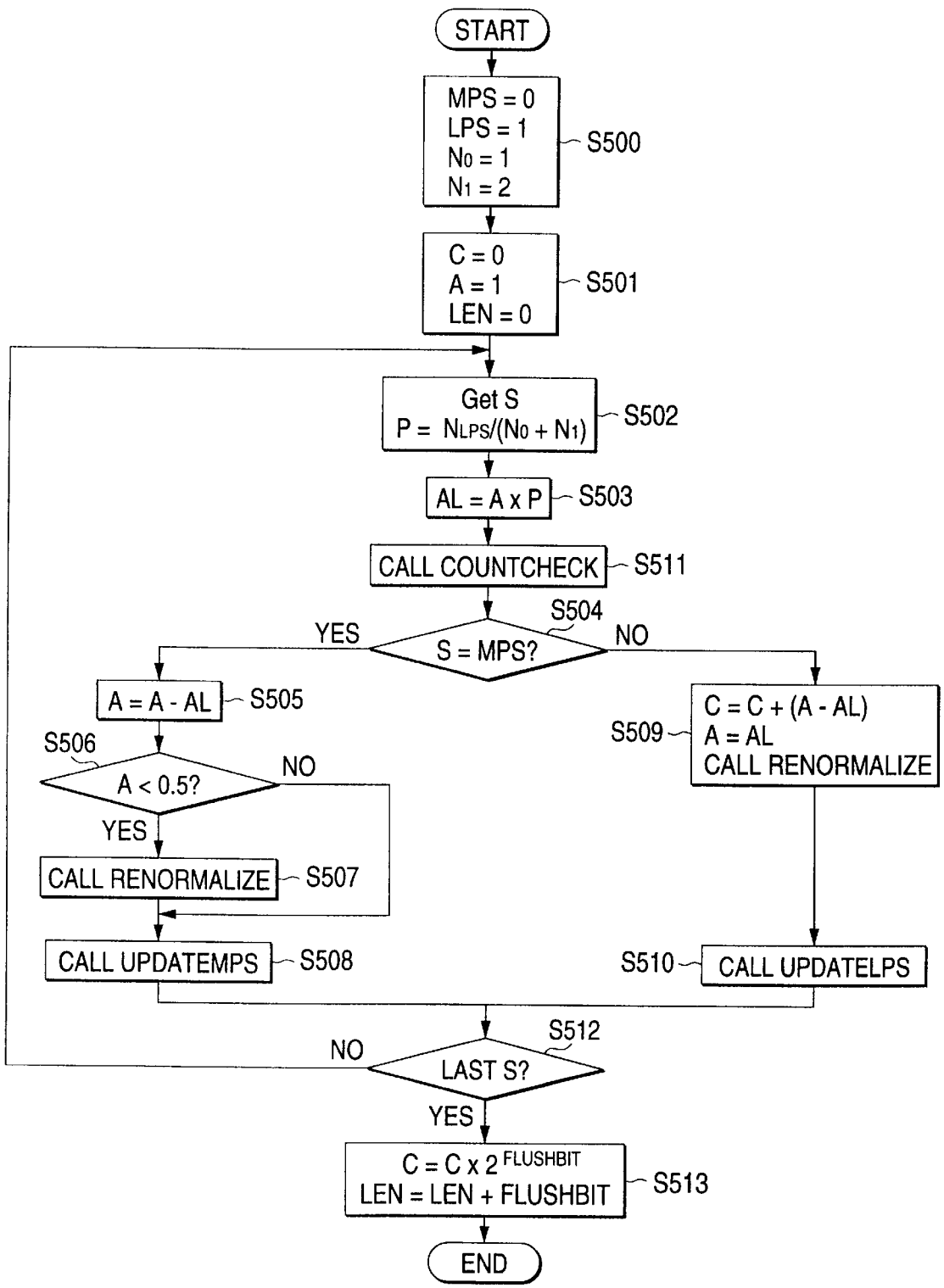
FIG. 14 is a flow chart for indicating a coding process of a third embodiment according to the present invention.

FIG. 14 indicates a flow chart for explaining the coding process sequential operation according to embodiment 3. A characteristic difference of embodiment 3 from embodiments 1 and 2 is such that the step S511 is interposed between the step S503 and the step 504, and the contents of other process steps are not changed.

At the COUNTCHECK step S511, a comparison is made between the occurrence frequency value N LPS of the less probable symbol (LPS) and a predetermined value T1. When N LPS is greater than T1, the value of the occurrence frequency N1 of the data 1 is reduced by ½. Also, at the COUNTCHECK step A511, the occurrence frequency value N MPS of the more probable symbol (MPS) is compared with a preselected value T2, and if N MPS is larger than T2, then the value of the occurrence frequency N2 of the data is reduced by ½.

In this case, in accordance with embodiment 3 in which the ½ reduction process is carried out after estimating the probability, since a total quantity of combinations (conditions) of the counter values becomes large, the coding efficiency can be improved, as compared with the above-explained embodiments 1 and 2, in which the ½ reduction process is carried out immediately after the occurrence frequency of the less probable symbol (LPS) becomes T1 and the occurrence frequency of the more probable symbol (MPS) becomes T2, namely before estimating the probability.

For example, in the conventional mode, since the counter value is updated by a half value thereof, even when, for instance, the total of the more probable symbol (MPS)s and the less probable symbol (LPS)s and also the respective count values of the less probable symbol (LPS)s are equal to any of (8, 1) and (8, 2), the probability estimated after being updated by (4, 1) becomes 1/4.

In accordance with embodiment 3, if the respective count values are updated by 1/2 after the probability has been estimated, then the respective counter values can be discriminated as 1/8 and 2/8 in the above example. As a result, since the conditions of the probability value can be further classified, the coding efficiency can be increased.

Figure 15:
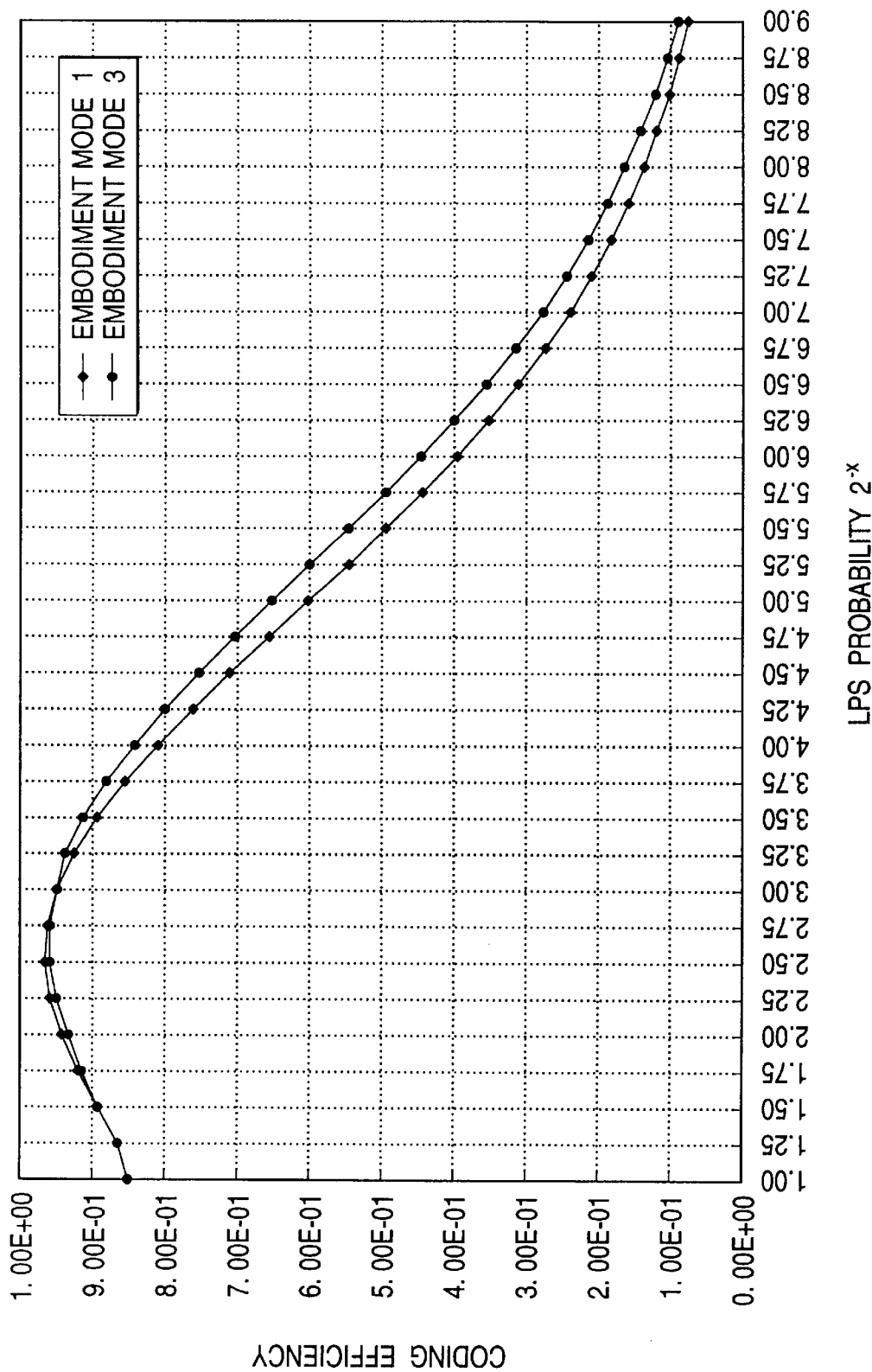
FIG. 15 is a graphic representation for showing a coding efficiency of the third embodiment.

FIG. 15 represents the results capable of increasing the coding efficiency. In FIG. 15, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, similar to embodiment 1, it is set T1=2 and T2=8. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Furthermore, this gives no adverse influence to the effect capable of essentially improving the probability estimating precision and the coding efficiency irrelevant to the correction process from the final code value to the minimum effective digit, and the removing process of the code bit 0 subsequent to the terminal.

It should be noted in embodiment 3 that preselected values may be used as the constants T1 and T2.

EMBODIMENT 4

Similar to embodiment 1 and embodiment 2, there is shown a coding process sequential operation according to embodiment 4 of the present invention when the arithmetic coding operation is applied to the binary data. It should be understood that variables and constants employed in this coding process sequential operation are similar to those used in embodiments 1 and 2.

Figure 16:
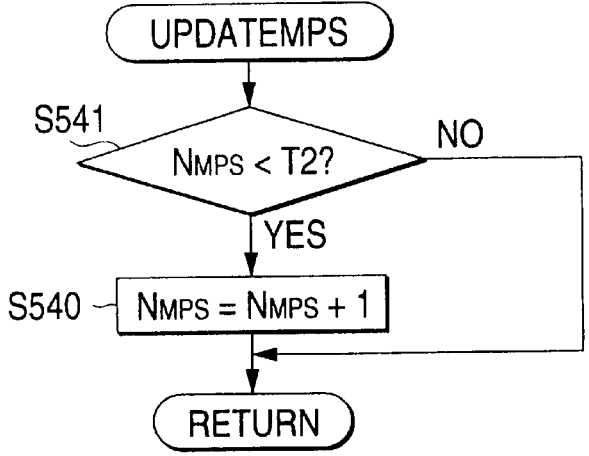
FIG. 16 is a flow chart for showing a process operation of UPDATEMPS of a fourth embodiment of the present invention.

This coding process sequential operation is indicated in FIG. 16.

A difference between the flow chart of embodiment 4 shown in FIG. 16 and the detailed flow chart of UPDATEMPS of embodiment 1 is such that at a step S541, a counting operation is carried out only when the occurrence frequency N MPS of the more probable symbol (MPS) is smaller than the constant value T2 equal to the maximum count value.

Figure 17:
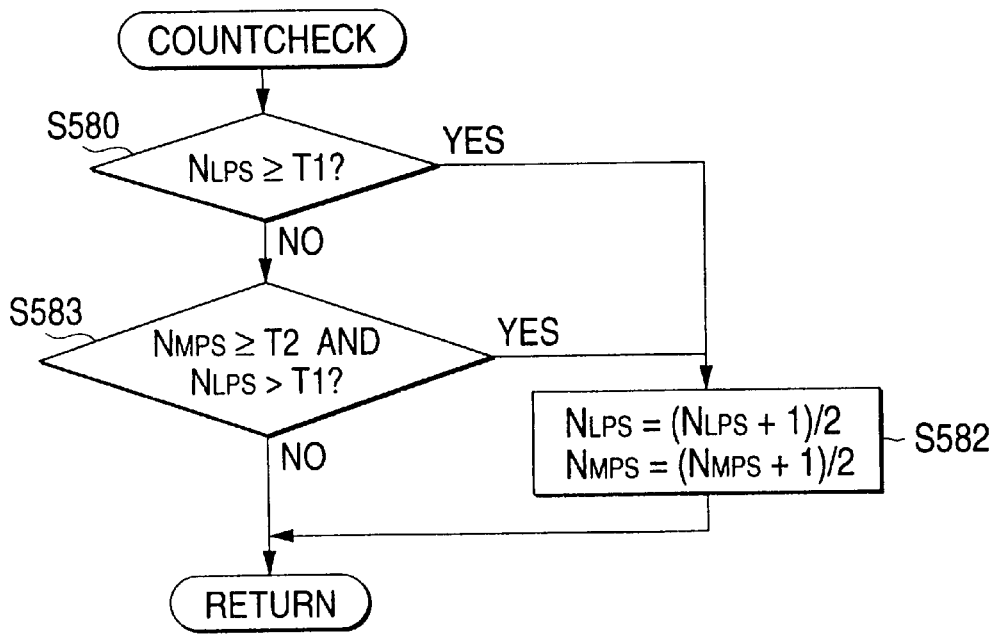
FIG. 17 is a flow chart for showing a process operation of COUNTCHECK of the fourth embodiment.

A difference between a flow chart of embodiment 4 shown in FIG. 17 and the detailed flow chart of COUNTCHECK of embodiment 1 is such that the step S581 is replaced by a step S583, and the ½ reduction process defined at the step S528 is carried out in the case that the occurrence frequency N MPS of the more probable symbol (MPS) is larger than the constant value T2, and furthermore, the occurrence frequency N LPS of the less probable symbol (LPS) is larger than 1 as an additional condition.

In this case, since the execution of the ½ reduction process is brought into the waiting condition only when the occurrence frequency N MPS of the more probable symbol (MPS) is equal to the constant value T2 corresponding to the maximum count value, and furthermore the occurrence frequency N LPS of the less probable symbol (LPS) is equal to 1 at the step S582, there is a possibility that the occurrence frequency of the more probable symbol (MPS) becomes T2 at the step S541. At this case, no counting operation is carried out.

Figure 18:
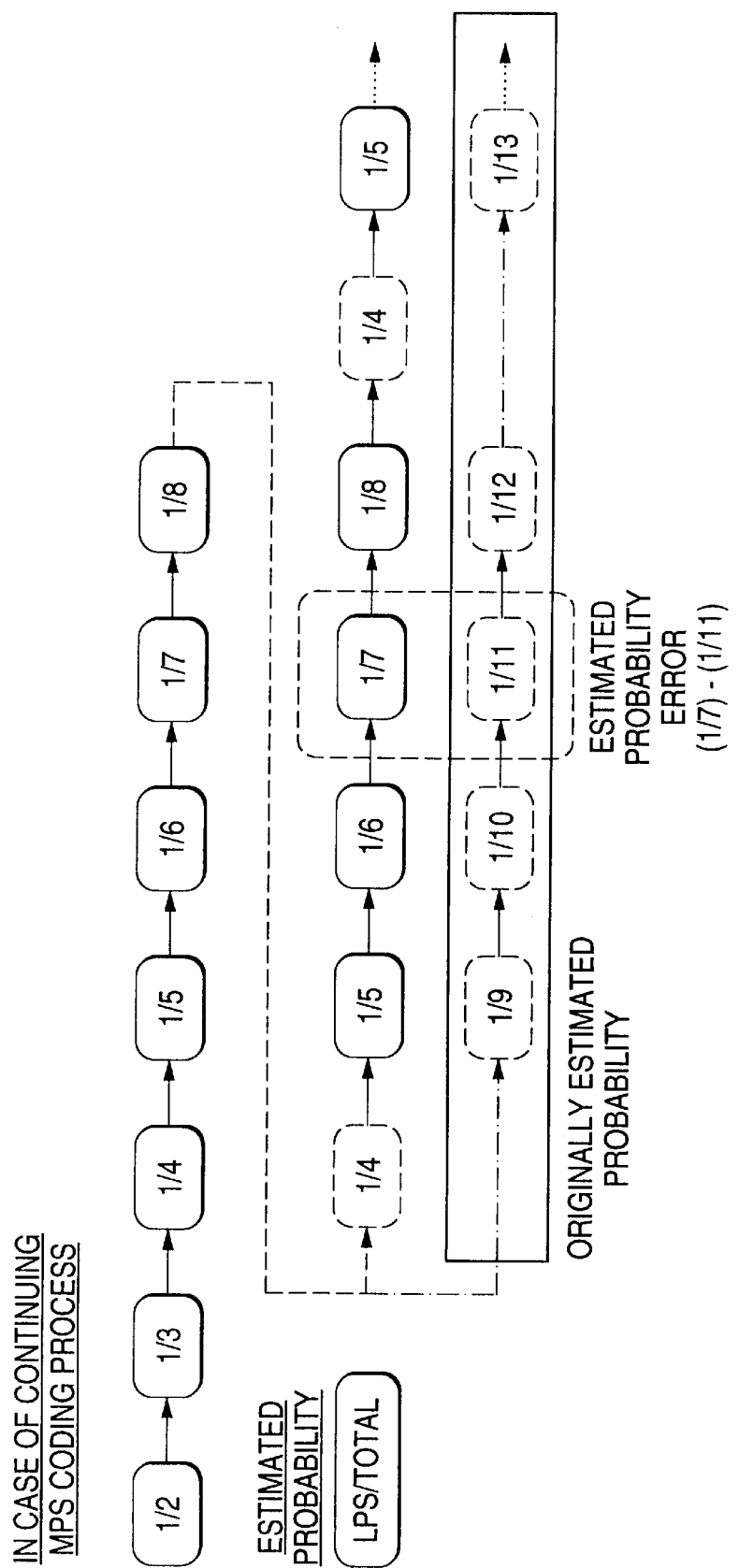
FIG. 18 is a diagram for explaining estimated probability of the fourth embodiment.
Figure 19:
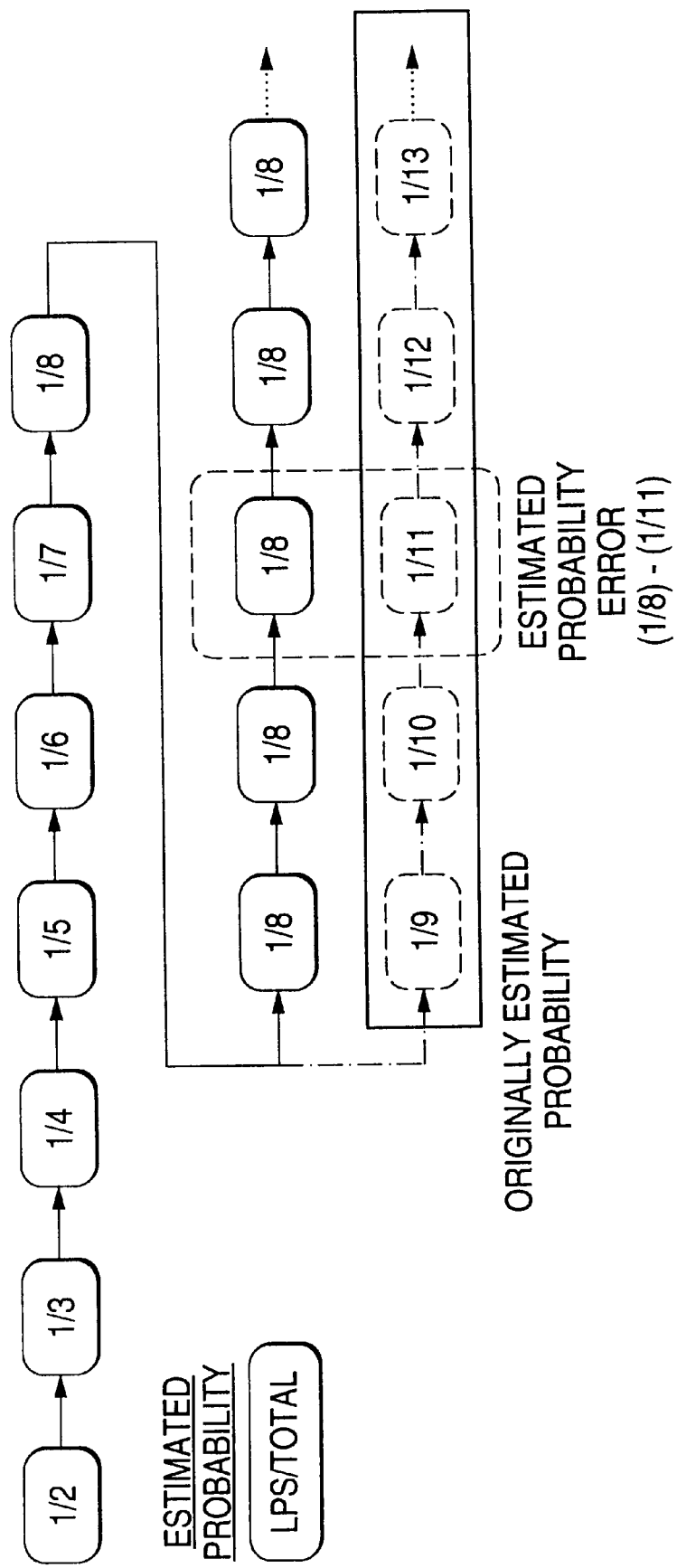
FIG. 19 is a diagram for explaining estimated probability of the fourth embodiment.

In this case, the error of the estimated probability occurred when the counting process operation is not carried out with respect to the occurrence of the more probable symbol (MPS), under (N MPS=T2, N LPS=1), and also the execution of the ½ reduction process operation is waited (see FIG. 19) can be made smaller with respect to such an ideal case that the counting operation can be infinitely carried out without considering the maximum value of the counter, as compared with such an embodiment mode 1 that the ½ reduction process operation is carried out under no restriction (see FIG. 18) immediately after the occurrence frequency of either the less probable symbol (LPS) or the more probable symbol (MPS) becomes maximum.

For instance, in the prior art, after the count value is updated, in particular, when the count value of the less probable symbol (LPS) becomes 1, the probability estimating error is enlarged, so that the coding efficiency is lowered.

Therefore, in accordance with this embodiment, when the count value of the less probable symbol (LPS) becomes 1, this count value is not updated by 1/2, but the count value remains. As a consequence, the probability estimating error can be made smaller and the coding efficiency can be increased.

Figure 20:
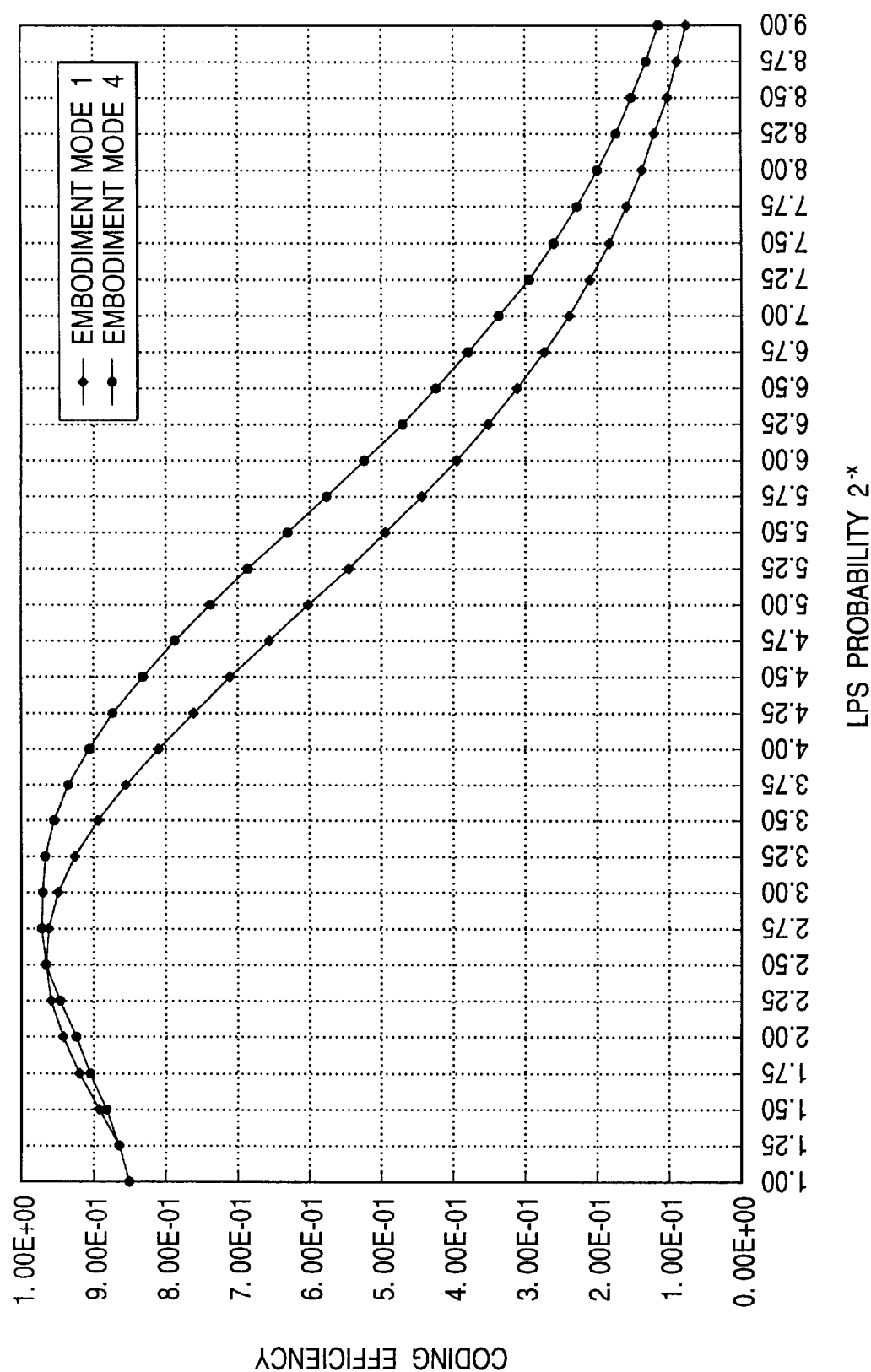
FIG. 20 is a graphic representation for indicating a coding efficiency of the fourth embodiment.

FIG. 20 indicates results representative of increasing of the coding efficiency achieved by embodiment 4. In FIG. 20, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, it is set T1=2 and T2=8 similar to the embodiment mode 1. While the occurrence frequency p0 of the data is varied, the respective data lengths are set to 100000. Then, the coding process operation was carried out by a single context.

Since the counting operation of the occurrence frequency is stopped, the coding efficiency is increased in such a case that the probability of the less probable symbol (LPS) is located near an inverse number (1/T2) of a maximum value of a total number of the more probable symbol (MPS) and the less probable symbol (LPS). When the probability is smaller than this inverse number (1/T2), the estimated error is increased, so that the coding efficiency is lowered. However, this coding efficiency is increased, as compared with such a case that the counting operation of the occurrence frequency is not stopped.

It should also be noted that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Furthermore, this gives no adverse influence to the effect capable of essentially improving the probability estimating precision and the coding efficiency irrelevant to the correction process from the final code value to the minimum effective digit, and the removing process of the code bit 0 subsequent to the terminal.

It should be noted in embodiment 4 that preselected values may be used as the constants T1 and T2.

EMBODIMENT 5

Similar to embodiment 1 and embodiment 2, there is shown a coding process sequential operation according to embodiment 5 of the present invention when the arithmetic coding operation is applied to the binary data. It should be understood that variables and constants employed in this coding process sequential operation are similar to those used in embodiments 1 and 2.

The coding process sequential operation according to embodiment 5 is so arranged by that the flow charts shown in FIG. 16 and FIG. 17 according to embodiment 4 are applied to the flow chart shown in FIG. 4.

In this arrangement, since the ½ reduction process operation is brought into the waiting condition only when the occurrence frequency of the more probable symbol (MPS) is equal to the constant value T2 corresponding to the maximum count value and also the occurrence frequency of the less probable symbol (LPS) is equal to 1, the probability value 1/T2 at this time is increased with respect to that of the embodiment mode 1.

Figure 21:
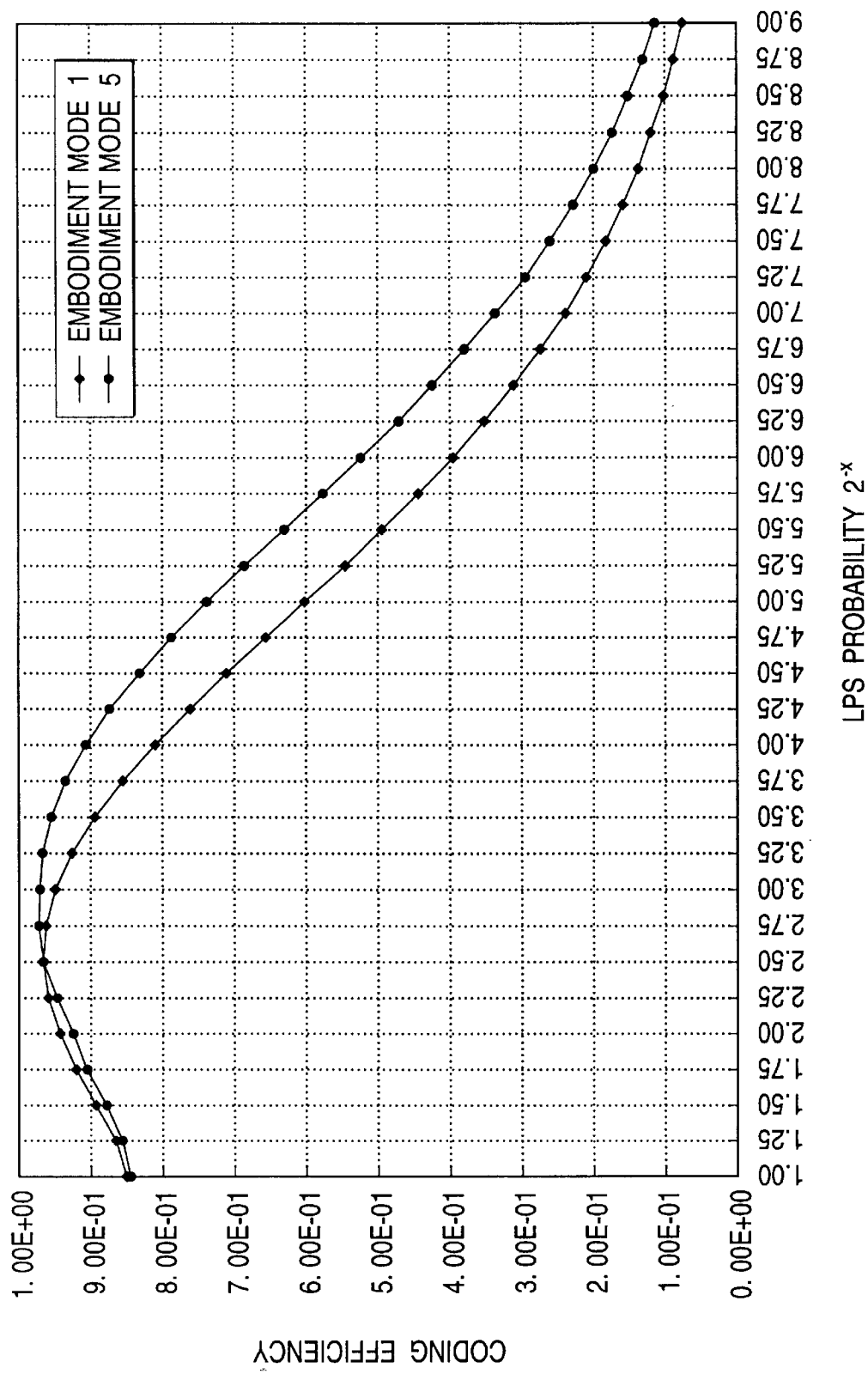
FIG. 21 is a graphic representation for indicating a coding efficiency of a fifth embodiment according to the present invention.

FIG. 21 represents the results capable of increasing the coding efficiency. In FIG. 21, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, similar to embodiment 1, it is set T1=2 and T2=8. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Furthermore, this gives no adverse influence to the effect capable of essentially improving the probability estimating precision and the coding efficiency irrelevant to the correction process from the final code value to the minimum effective digit, and the removing process of the code bit 0 subsequent to the terminal.

It should be noted in the embodiment mode 5 that preselected values may be used as the constants T1 and T2.

The effects/advantages of the above-described embodiment 1 to 5 will now be explained.

Figure 22:
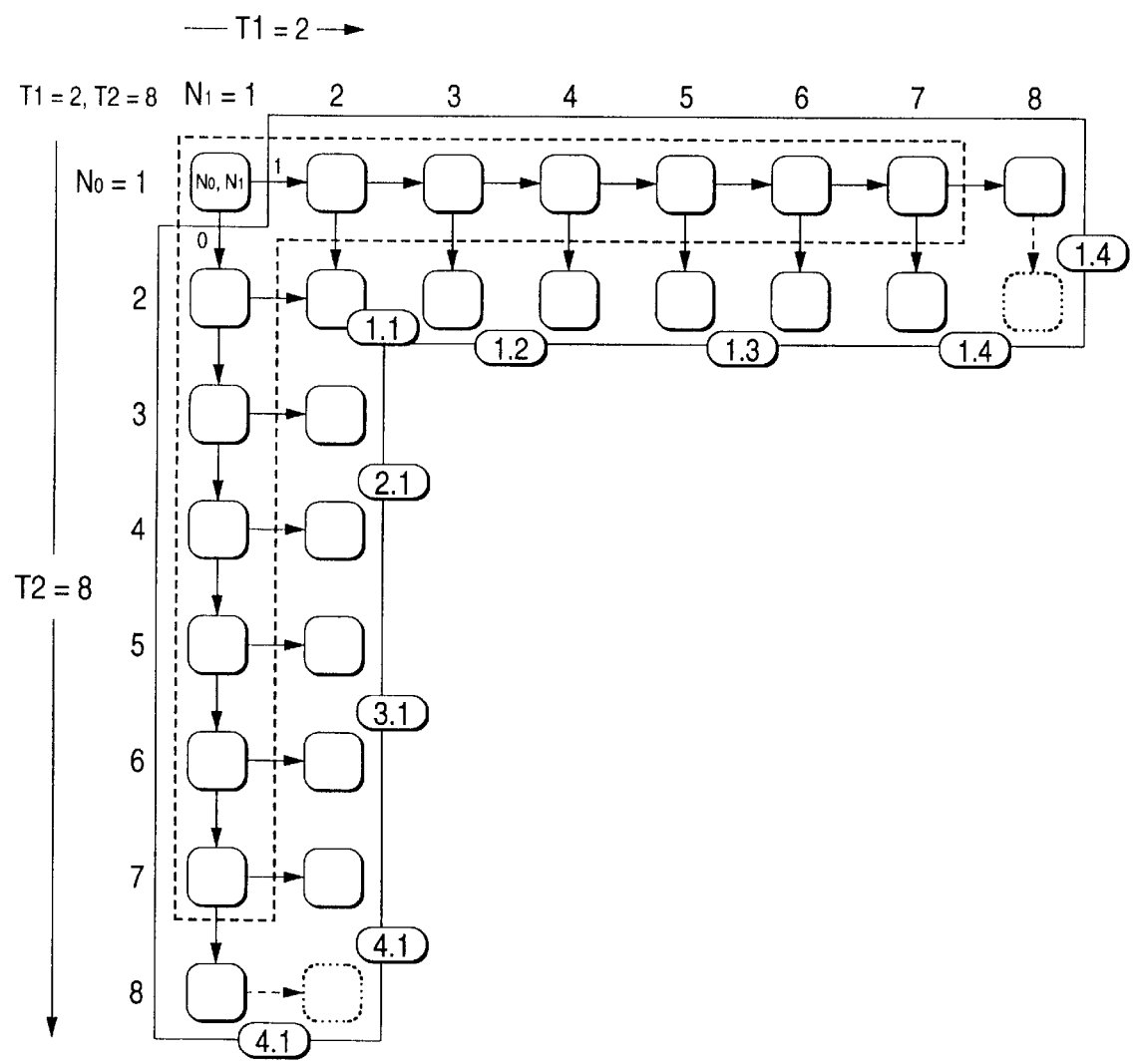
FIG. 22 is an illustration for representing state transition of coding operation.

As to embodiment 3 (FIG. 15), embodiment 4 (FIG. 20), and embodiment 5 (FIG. 21), there are represented the coding efficiencies under condition of T1=2 and T2=8. The state transitions at this time will now be explained with reference to FIG. 22. In this drawing, a state surrounded by a broken line indicates such a state used to estimate the probability when the ½ reduction process operation is carried out just after the occurred symbols are counted in embodiment 3. A state surrounded by a solid line indicates such a state employed to estimate the probability when the ½ reduction process operation is carried out immediately before the occurred symbols are counted in embodiment 3 and embodiment 4. In embodiment 5, both (N0=8, N1=1) and (N0=1, N1=8) are added to the state of embodiment 1. Any of these states represent transitable states except for the states stayed only in the initial transition stage. For instance, (N0=1, N1=1) is achieved only under initial condition. Both (N0=8, N1=2) and (N0=2, N1=8) are used only when under (N0=8, N1=1) and (N0=1, N1=8), the occurrences of the more probable symbol (MPS)s are not counted in embodiment 4 and embodiment 5. A total number of states is either 13 (embodiment 1) or 15 (embodiment 5) in such a case that the ½ reduction process operation is performed just after the symbol occurrence is counted (a portion surrounded by a broken line). A total number of states is either 25

(embodiment 3) is or 15 (embodiment 4) in such a case that the ½ reduction process operation is performed just before the symbol occurrence is counted. As a consequence, there are the larger total number of states in the case that the ½ reduction process operation is carried out immediately before the symbol occurrence is counted.

Figure 23:
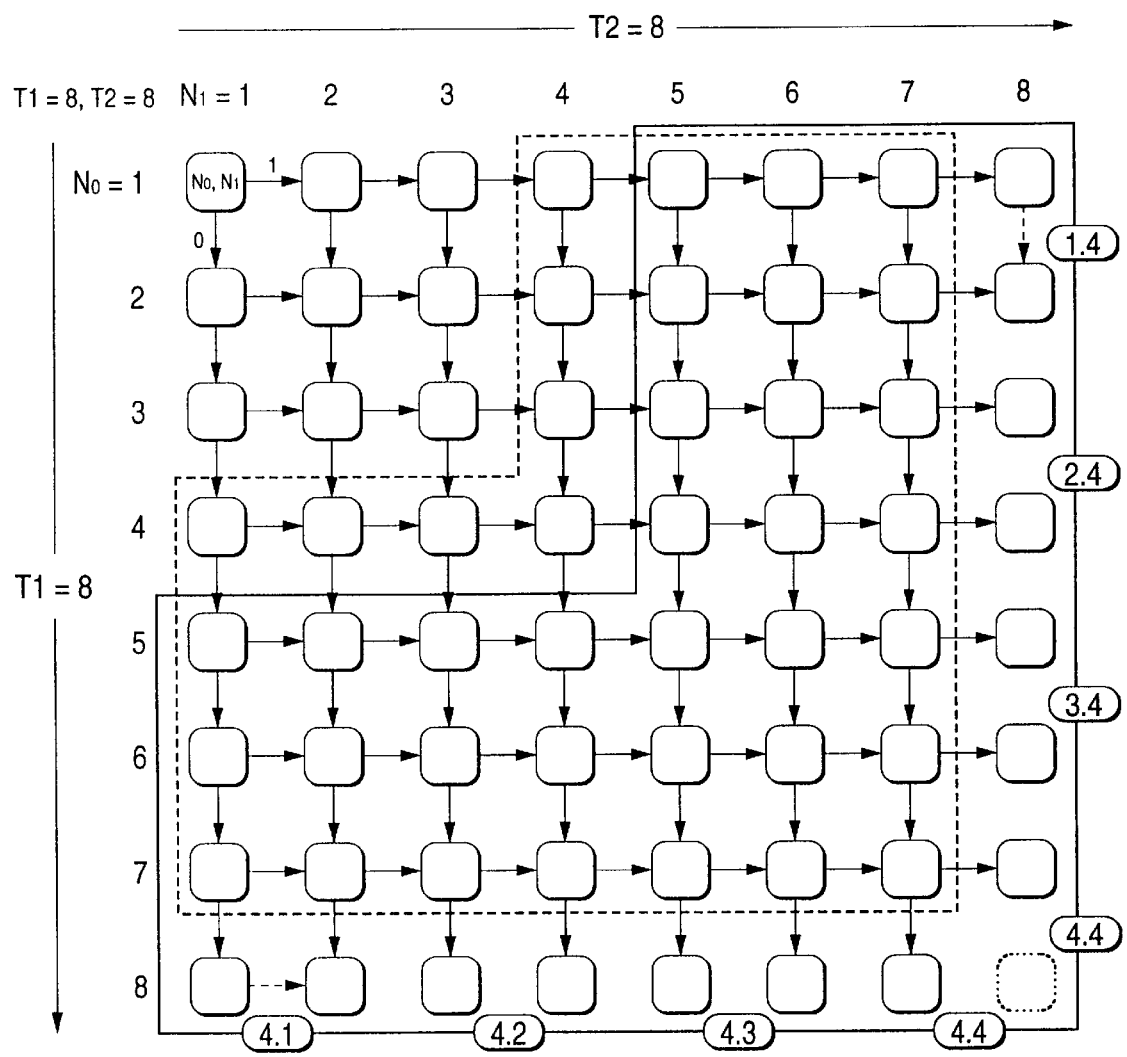
FIG. 23 is an illustration for representing state transition of coding operation.
Figure 24:
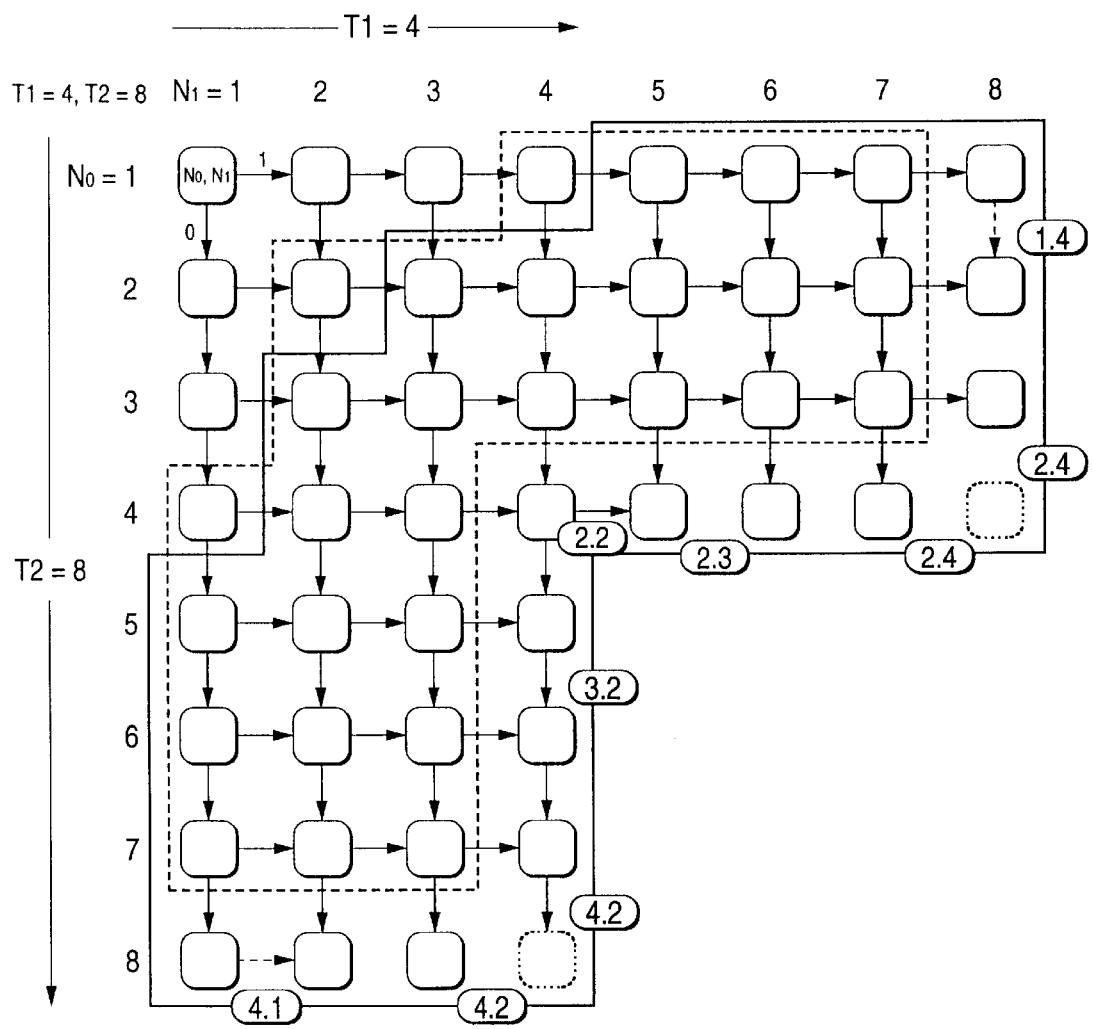
FIG. 24 is an illustration for representing state transition of coding operation.

Also, for example, when the constants T1 are different from each other, namely when T1=8 and T2=8 (FIG. 23), the total number of states are 40, 47, 47, 42 in this order of embodiments 1, 2, 4, and 5. When T1=4 and T2=8 (FIG. 24), the number of states are 28, 38, 38, 40 in this order of embodiments 1, 2, 4, and 5.

Furthermore, when the more probable symbol (MPS)s are discriminated, only such the number of states under which a total number of N0 becomes equal to a total number of N1 within the surrounded frame are increased. This discriminatively indicates that the occurrence frequency is transferred to the same number of states, depending upon the transition (longitudinal direction) by the appearance of the data value 0, and the transition (lateral direction) by the appearance of the data value 1 in this drawing. In these examples, since the arithmetic coding operation with employment of the multiplication is applied as the entropy coding device, the size of the effective region can be equally divided. However, in the case of the subtraction type arithmetic coding operation for reducing the calculation load, the fixed value and the remainder thereof are allocated to the size of the effective region. As a consequence, at this time, the coding efficiency is increased by allocating the larger region to the more probable symbol (MPS) having the high occurrence probability.

In the case that an occurrence frequency is counted by a binary counter with 3 digits, when 8 is set as the maximum count value T2, this binary counter is overflowed. However, since there is no possibility that the occurrence frequency becomes 0, if this occurrence frequency is interpreted as the substitution of 8, then this occurrence frequency counting operation can be realized without extending the digit number of the binary counter, while maintaining the 3 digits. Also, the occurrence frequencies with respect to the respective contexts are stored into a memory. After the counting process operation and the ½ reduction process operation have been carried out with respect to the read frequency values, the processed frequency values are again written into this memory, so that a total quantity of calculators can be reduced in packaging.

EMBODIMENT 6

Figure 25:
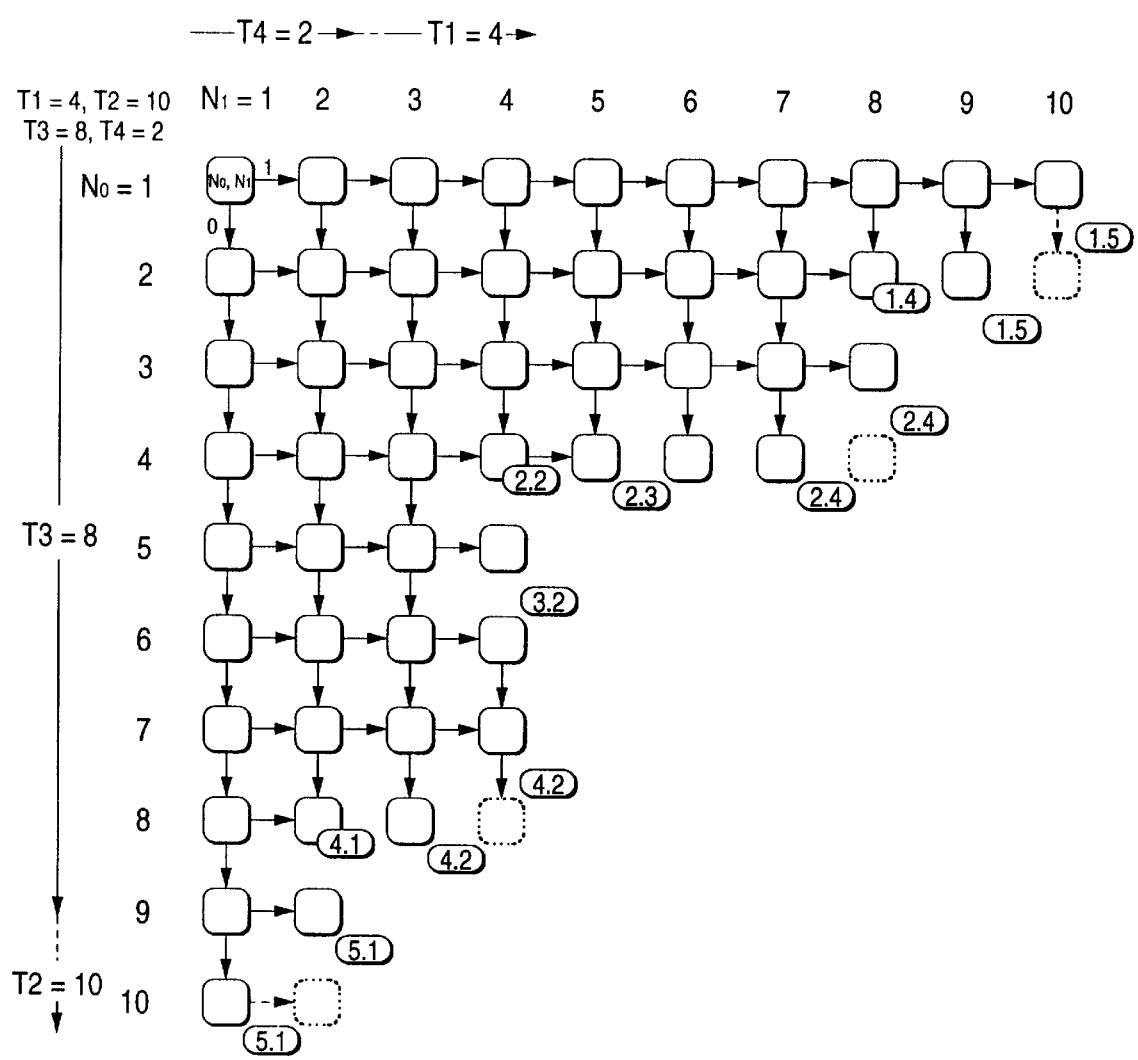
FIG. 25 is an illustration for indicating state transition of a sixth embodiment according to the present invention.

Embodiment 4 and embodiment 5 have described that the coding efficiency could be increased in such a manner that even when the occurrence frequency of the more probable symbol (MPS) becomes T2, if the occurrence frequency of the less probable symbol (LPS) is equal to 1, then no ½ reduction process operation is carried out. Embodiment 6 is featured by that as one example, while the embodiment 4 is employed as a basic idea, two constants are further introduced, and a state is increased such that the occurrence frequency of the more probable symbol (MPS) becomes larger than, or equal to T3, and also the occurrence frequency of the less probable symbol (LPS) becomes smaller than, or equal to T4. FIG. 25 indicates a state transition diagram in the case that T1=4, T2=10, T3=8, and T4=2. Such a state that the occurrence frequency N MPS of the more probable symbol (MPS) is smaller than, or equal to T3 is similar to the state previously explained in the embodiment mode 4. Next, a calculation is made of performance in such a case that the ½ reduction process operation is brought into the waiting condition when (N TOTAL=T2, N LPS=1).

It should be noted that symbol "T3" indicates an intermediate value of N TOTAL (otherwise N MPS); symbol "IT4" shows an intermediate value of N LPS; symbol "T3" represents a third threshold; and symbol "T4" denotes a fourth threshold value.

Figure 26:
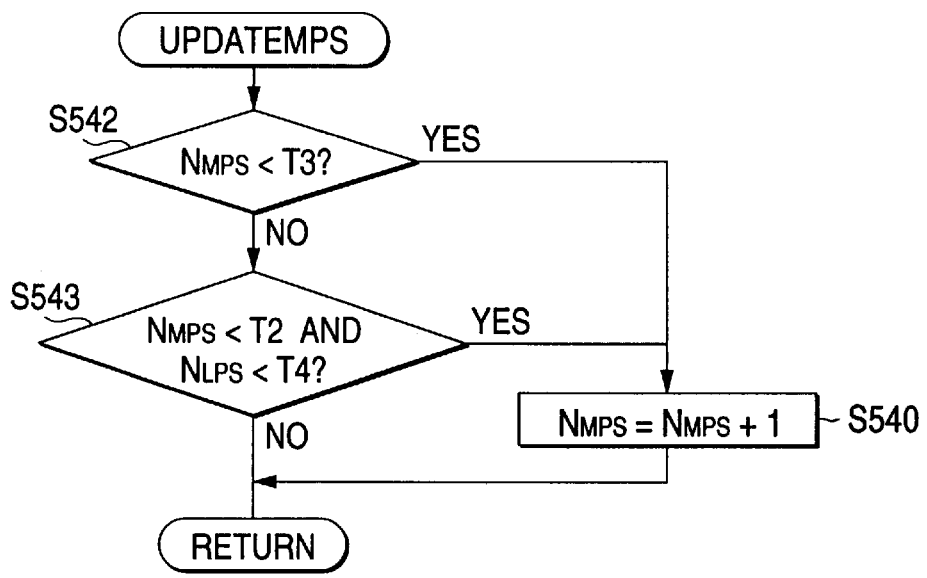
FIG. 26 is a flow chart for showing a process operation of UPDATEMPS of the sixth embodiment.
Figure 27:
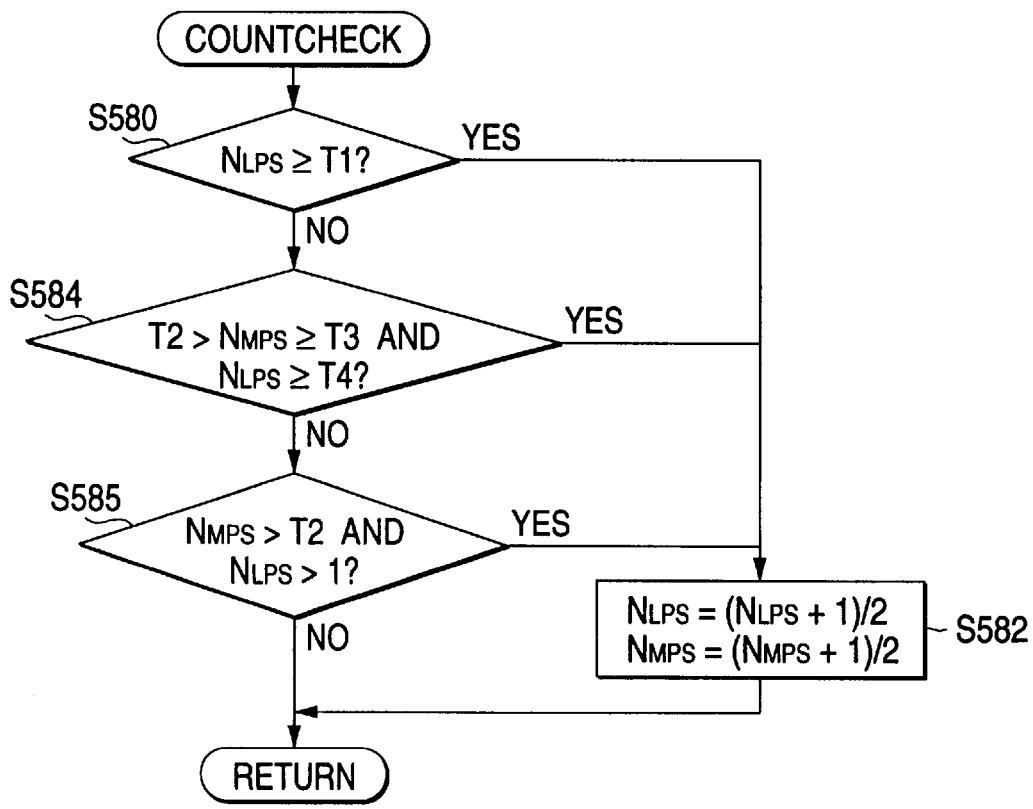
FIG. 27 is a flow chart for showing a process operation of COUNTCHECK of the sixth embodiment.

In FIG. 26 and FIG. 27, there are shown a coding process sequential operation according to embodiment 6 in flow chart form.

A difference of this coding process sequential operation (see FIG. 26) according to embodiment 6 from that (see FIG. 16) of embodiment 4 is given as follows: That is, when the occurrence frequency N MPS of the more probable symbol (MPS) is smaller than the constant value T3 at a step S542, or when the occurrence frequency N MPS of the more probable symbol (MPS) is smaller than the constant value T2 corresponding to the maximum count value, and further the occurrence frequency N LPS of the less probable symbol (LPS) is smaller than the constant value T4 at a step S543, the occurrence frequency N MPS of the more probable symbol (MPS) is counted at a step S540.

A difference of this coding process sequential operation (see FIG. 27) according to embodiment 6 from that (see FIG. 17) of embodiment 4 is given as follows: That is, the step S583 is replaced by the steps S584 and S585. Also, in such a case that the occurrence frequency N MPS of the more probable symbol (MPS) is larger than, or equal to the constant value T3 and smaller than the constant value T2, as well as the occurrence frequency N LPS of the less probable symbol (LPS) is larger than the constant value T4 at a step 583, the ½ reduction process operation defined at the step S582 is carried out. Otherwise, in such a case that the occurrence frequency N MPS of the more probable symbol (MPS) is larger than the constant value T2 corresponding to the maximum count value, as well as the occurrence frequency N LPS of the less probable symbol (LPS) is larger than 1, the above-described ½ reduction process operation defined at the step S582 is carried out.

Figure 28:
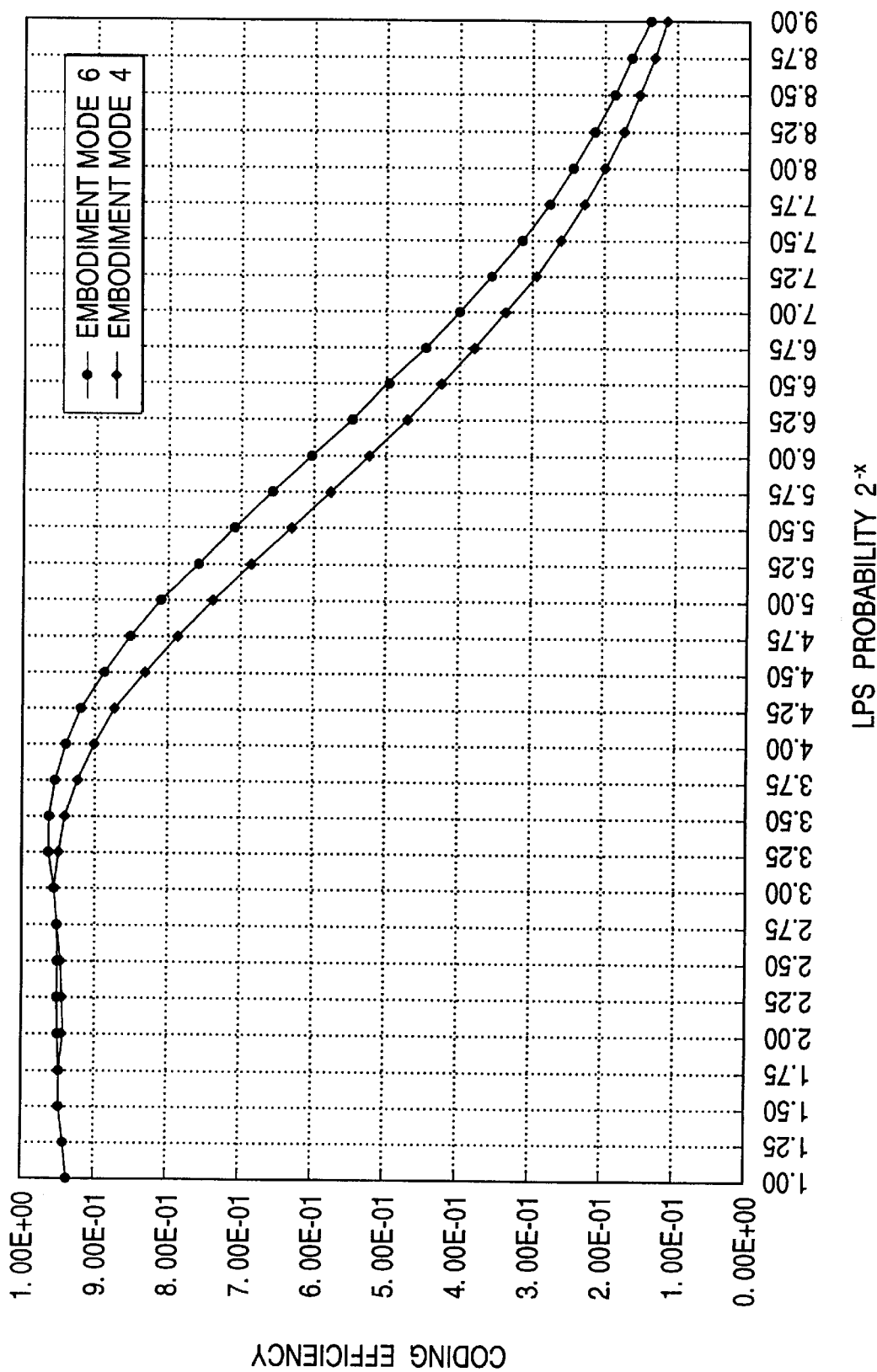
FIG. 28 is a graphic representation for showing a coding efficiency of the sixth embodiment.

FIG. 28 represents the results capable of increasing the coding efficiency of this embodiment. In FIG. 28, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, it is set T1=8 (T1 having substantially no meaning), T2=10, T3=8, and T4=2, which are acquired by extending the embodiment mode 1. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Also, this gives no adverse influence to the effect capable of essentially improving the probability estimating precision and the coding efficiency irrelevant to the correction process from the final code value to the minimum effective digit, and the removing process of the code bit 0 subsequent to the terminal.

It should be noted in embodiment 6 that preselected values may be used as the constants T1, T2, T3, and T4.

EMBODIMENT 7

In the previously explained embodiments, the variable related to either the constant T2 or the constant T3 has been explained as the occurrence frequency N MPS of the more probable symbol (MPS). It should be understood that a summation between an occurrence frequency of a more probable symbol (MPS) and an occurrence frequency of a less probable symbol (LPS) is employed as this variable in the below-mentioned embodiments.

In the coding process sequential operation according to embodiment 7, the coding process sequential operation of embodiment 3 is changed by that the occurrence frequency counter of the more probable symbol (MPS) is used as a counter for a total occurrence frequency of a more probable symbol (MPS) and a less probable symbol (LPS).

Figure 29:
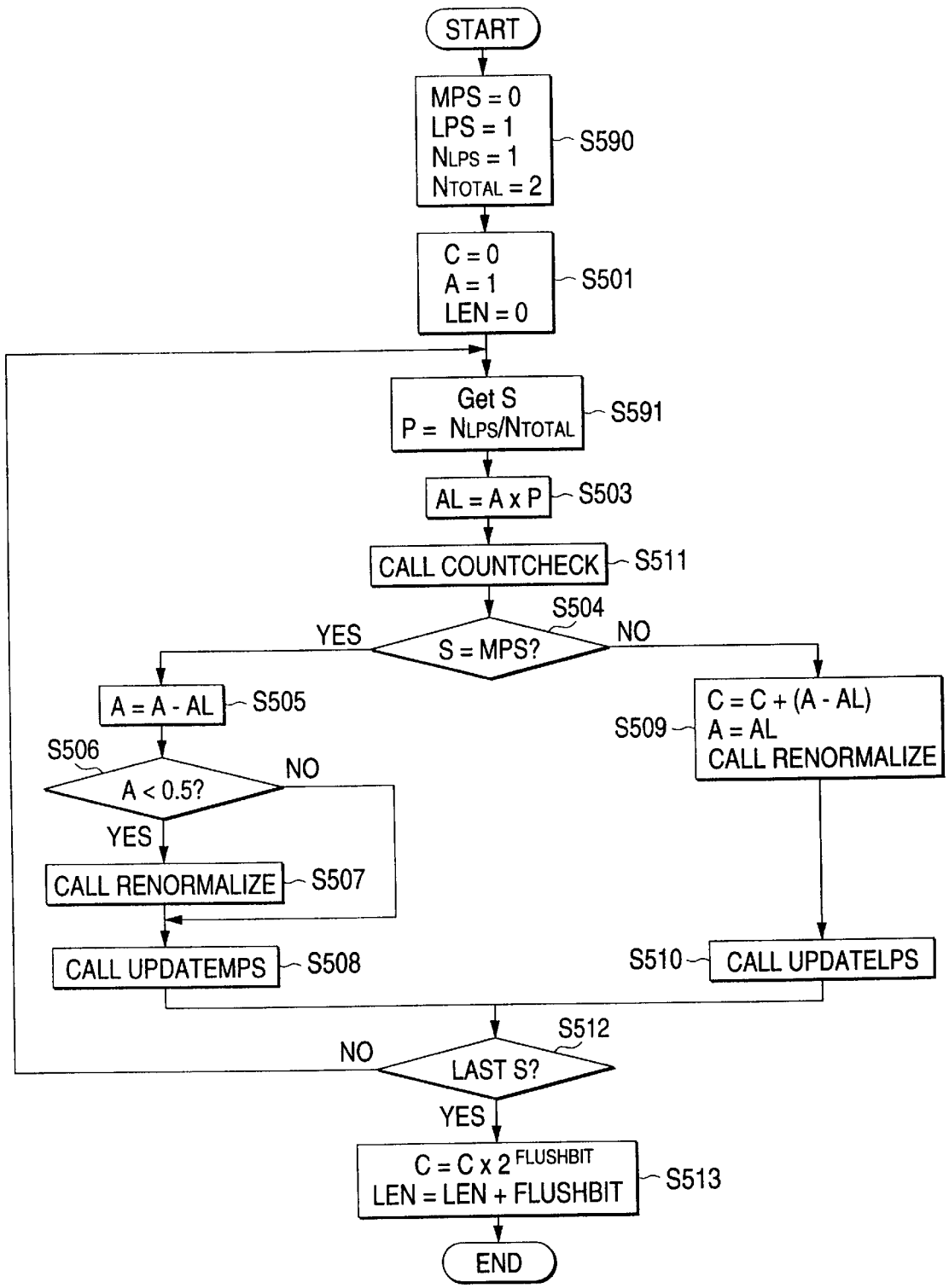
FIG. 29 is a flow chart for indicating a coding process of a seventh embodiment according to the present invention.

That is, the coding process sequential operation according to embodiment 7 is represented in FIG. 29.

Similar to the relationship with embodiment 3, the coding process sequential operation shown in FIG. 29 is featured by that a call COUNTCHECK step S511 is interposed between the step S503 and the step 504. Other process sequential operations of embodiment 7 are not changed.

Figure 30:
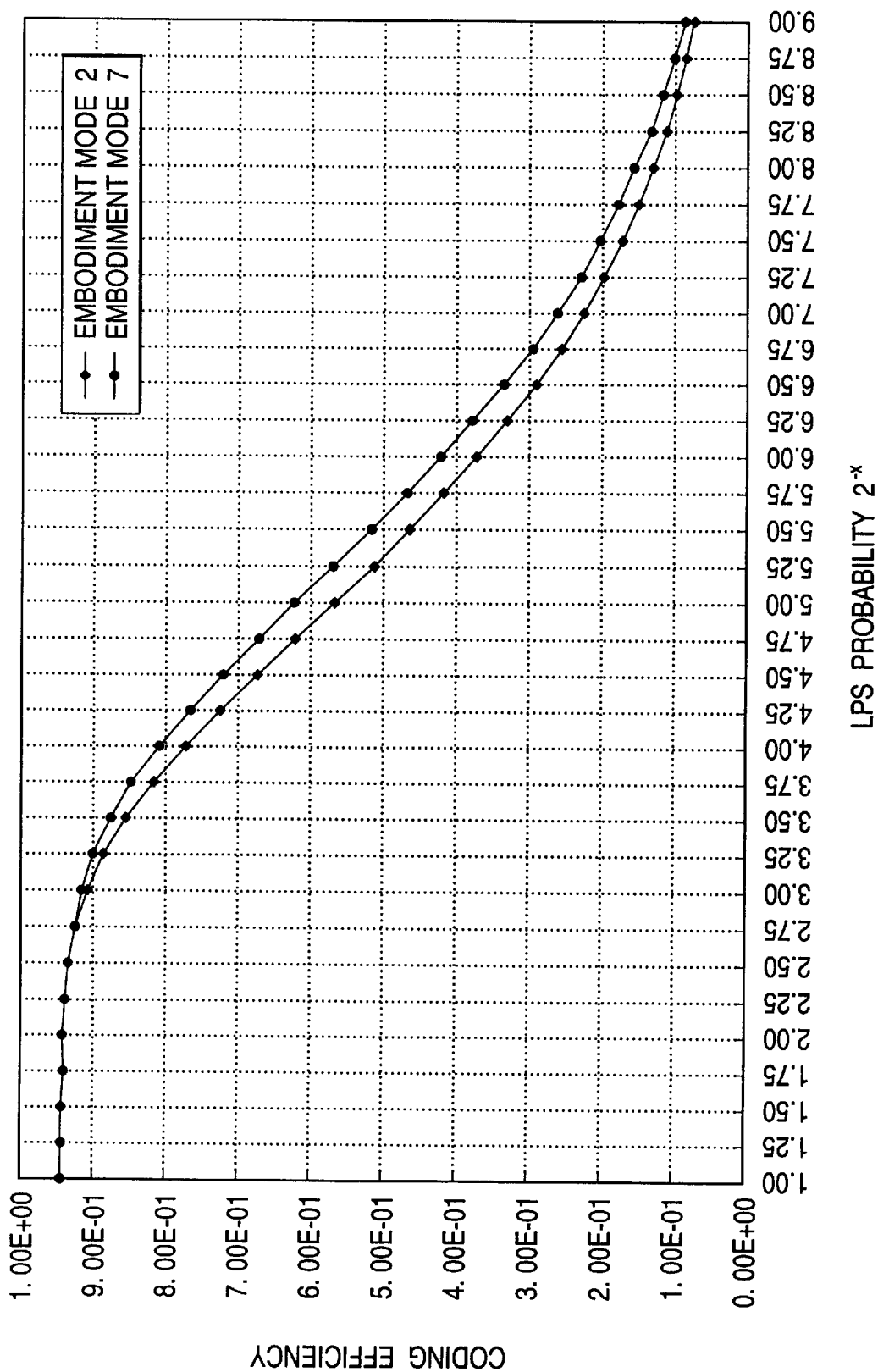
FIG. 30 is a graphic representation for showing a coding efficiency of the seventh embodiment.

FIG. 30 represents the results capable of increasing the coding efficiency. In FIG. 30, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, similar to embodiment 4, it is set T1=4 and T2=8. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Also, this gives no adverse influence to the effect capable of essentially improving the probability estimating precision and the coding efficiency, according to the present invention, irrelevant to the correction process from the final code value to the minimum effective digit, and the removing process of the code bit 0 subsequent to the terminal.

It should be noted in embodiment 7 that preselected values may be used as the constants T1 and T2.

EMBODIMENT 8

In a coding process sequential operation according to embodiment 8, the coding process sequential operation of embodiment 4 is changed by that the occurrence frequency counter of the more probable symbol (MPS) is used as a counter for a total occurrence frequency of a more probable symbol (MPS) and a less probable symbol (LPS).

Figure 31:
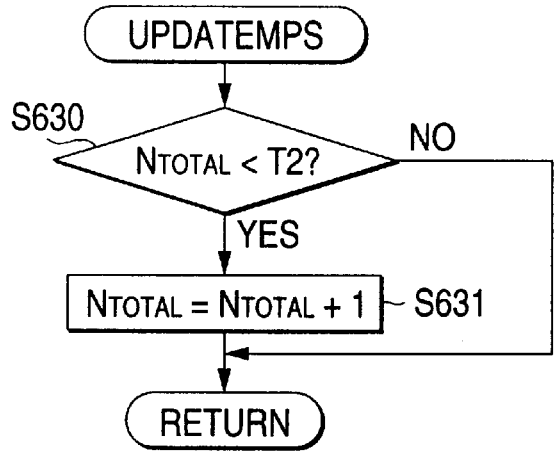
FIG. 31 is a flow chart for showing a process operation of UPDATEMPS of an eight embodiment according to the present invention.
Figure 32:
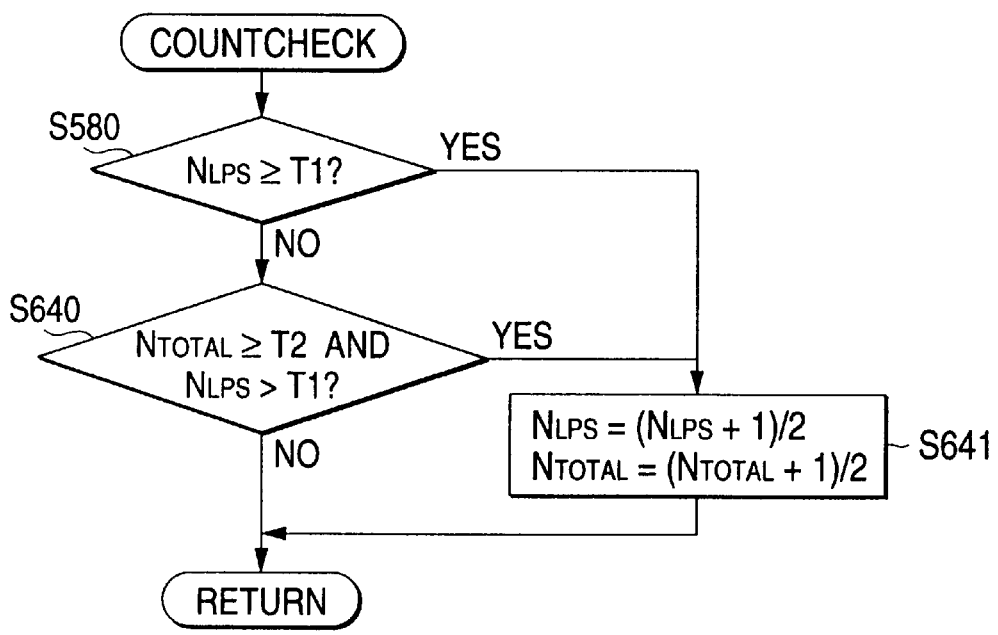
FIG. 32 is a flow chart for showing a process operation of COUNTCHECK of the eighth embodiment.

That is, the coding process sequential operation according to embodiment 8 is represented in FIG. 31 and FIG. 32.

Similar to the relationship with embodiment 1 and embodiment 3, the coding process sequential operation described in FIG. 31 is featured by that a judgment defined at a step S630 is newly added, and if a total N TOTAL of the occurrence frequencies of the more probable symbol (MPS) and the less probable symbol (LPS) become T2, then the counting operation of the occurrence frequency is not performed.

Similar to the relationship with the embodiment mode 1 and embodiment 3, the coding process sequential operation described in FIG. 32 is featured by that a judgment defined at a step S640 is changed. Also, in the case that the total N TOTAL of the occurrence frequencies of the more probable symbol (MPS) and the less probable symbol (LPS) is larger than, or equal to T2, as well as the occurrence frequency N LPS of the less probable symbol (LPS) is larger than, or equal to 1, the ½ reduction process operation of the occurrence frequency is carried out.

Figure 33:
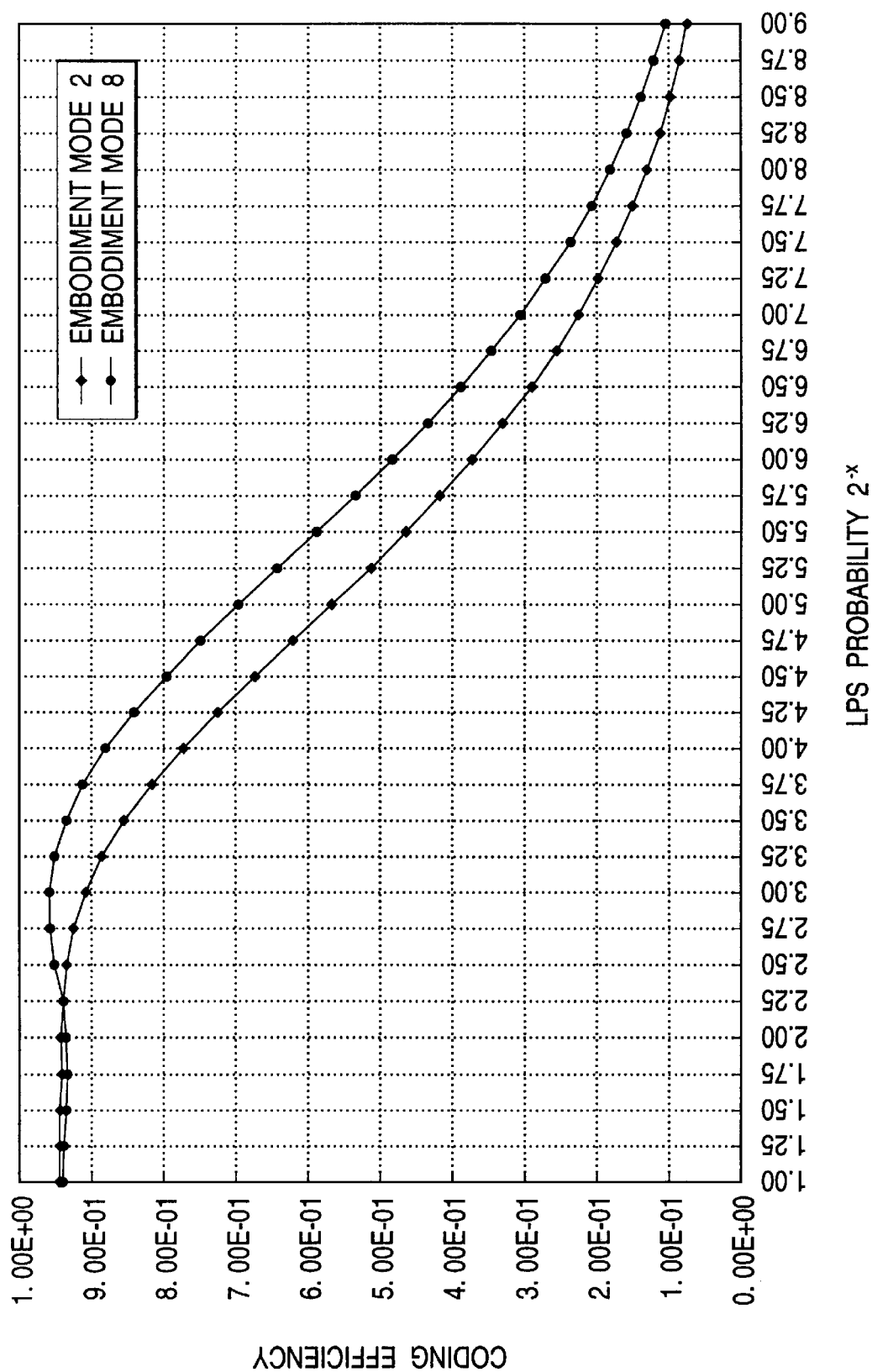
FIG. 33 is a graphic representation for showing a coding efficiency of the eighth embodiment.

FIG. 33 represents the results capable of increasing the coding efficiency. In FIG. 33, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, similar to embodiment 2, it is set T1=4 and T2=8. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Furthermore, this gives no adverse influence to the effect capable of essentially improving the probability estimating precision and the coding efficiency, according to the present invention (embodiment mode), irrelevant to the correction process from the final code value to the minimum effective digit, and the removing process of the code bit 0 subsequent to the terminal.

It should be noted in the embodiment mode 8 that preselected values may be used as the constants T1 and T2.

EMBODIMENT 9

In a coding process sequential operation according to embodiment 9, the coding process sequential operation of embodiment 5 is changed by that the occurrence frequency counter of the more probable symbol (MPS) is used as a counter for a total occurrence frequency of a more probable symbol (MPS) and a less probable symbol (LPS).

That is, the coding process sequential operation according to embodiment 9 is arranged in such a way that the flow operation of FIG. 29 in embodiment 8 is returned to the flow operation of FIG. 9 in embodiment 2 based on the flow operation of FIG. 5 in embodiment 1, the flow operations of FIG. 9 and FIG. 11 in embodiment 2, and the flow operations of FIG. 31 and FIG. 32 in embodiment 8.

Figure 34:
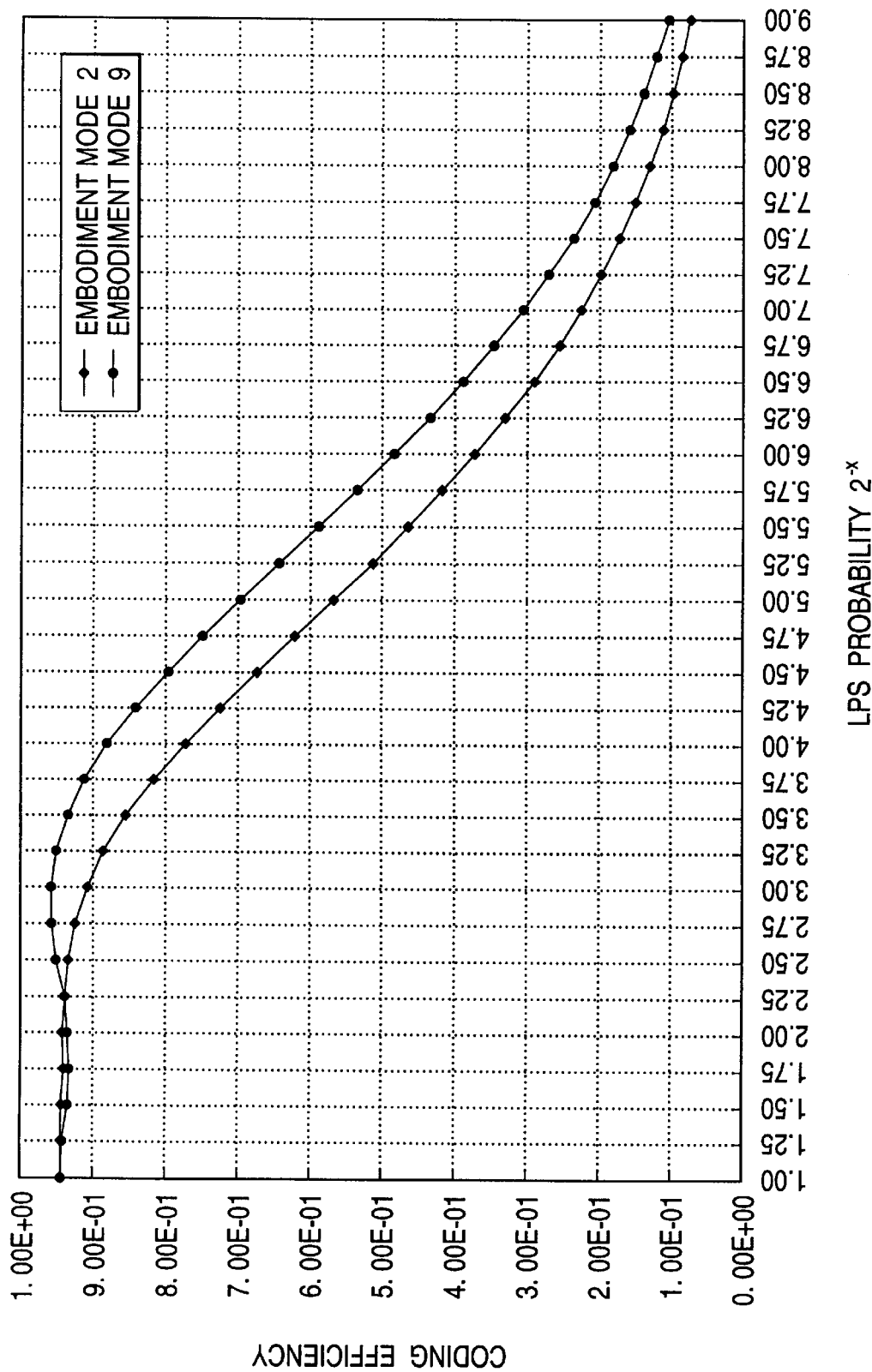
FIG. 34 is a graphic representation for showing a coding efficiency of a ninth embodiment according to the present invention.

FIG. 34 represents the results capable of increasing the coding efficiency. In FIG. 34, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, similar to embodiment 4, it is set T1=4 and T2=8. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Furthermore, this gives no adverse influence to the effect capable of essentially improving the probability estimating precision and the coding efficiency, according to the present invention (embodiment mode), irrelevant to the correction process from the final code value to the minimum effective digit, and the removing process of the code bit 0 subsequent to the terminal.

It should be noted in embodiment 9 that preselected values may be used as the constants T1 and T2.

EMBODIMENT 10

In a coding process sequential operation according to embodiment 10, the coding process sequential operation of embodiment 6 is changed by that the occurrence frequency counter of the more probable symbol (MPS) is used as a counter for a total occurrence frequency of a more probable symbol (MPS) and a less probable symbol (LPS).

Figure 35:
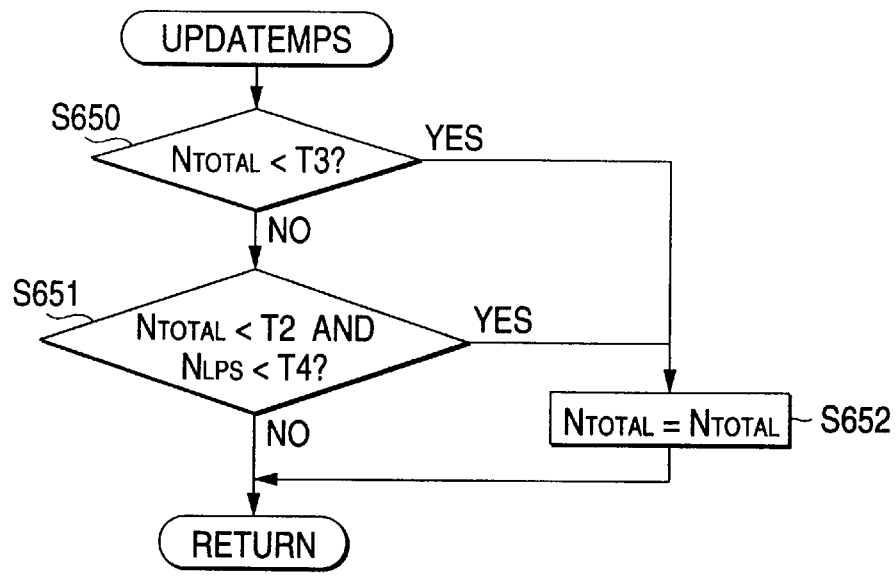
FIG. 35 is a flow chart for showing a process operation of UPDATEMPS of a tenth embodiment of the present invention.
Figure 36:
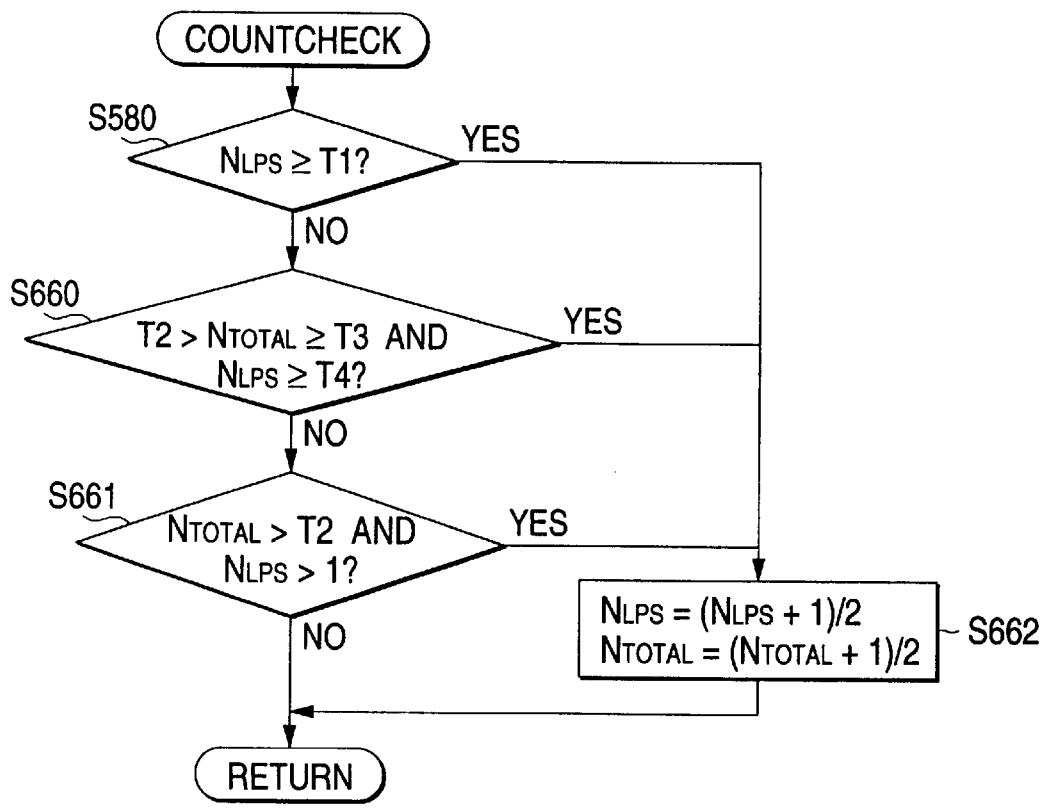
FIG. 36 is a flow chart for showing a process operation of COUNTCHECK of the tenth embodiment.

That is, the coding process sequential operation according to embodiment 10 is represented in FIG. 35 and FIG. 36.

A difference of the process sequential operation shown in FIG. 35 according to embodiment 10 from that of embodiment 6 is given as follows: When the total N TOTAL of the occurrence frequencies of the more probable symbol (MPS) and the less probable symbol (LPS) is smaller than the constant value T3 at a step S650, or when the total N TOTAL of the occurrence frequencies of the more probable symbol (MPS) and the less probable symbol (LPS) is smaller than the constant value T2 corresponding to the maximum count value, as well as the occurrence frequency N LPS of the less probable symbol (LPS) is smaller than the constant value T4 at a step S651, the total N TOTAL of the occurrence frequencies of the more probable symbol (MPS) and the less probable symbol (LPS) is counted at a step S652.

A difference of the process sequential operation shown in FIG. 36 according to embodiment 10 from that of embodiment 6 is given as follows: When the total N TOTAL of the occurrence frequencies of the more probable symbol (MPS) and the less probable symbol (LPS) is smaller than the constant value T2 and also larger than, or equal to the constant value T2, as well as the occurrence frequency N LPS of the less probable symbol (LPS) is larger than, or equal to the constant value T4 at a step S600, a ½ reduction process operation defined at a step S662 is carried out. Otherwise, when the total N TOTAL of the occurrence frequencies of the more probable symbol (MPS) and the less probable symbol (LPS) is larger than, or equal to the constant value T2 corresponding to the maximum count value, as well as the occurrence frequency N LPS of the less probable symbol (LPS) is larger than 1 at a step S661, the ½ reduction process operation defined at the step S662 is performed.

Figure 37:
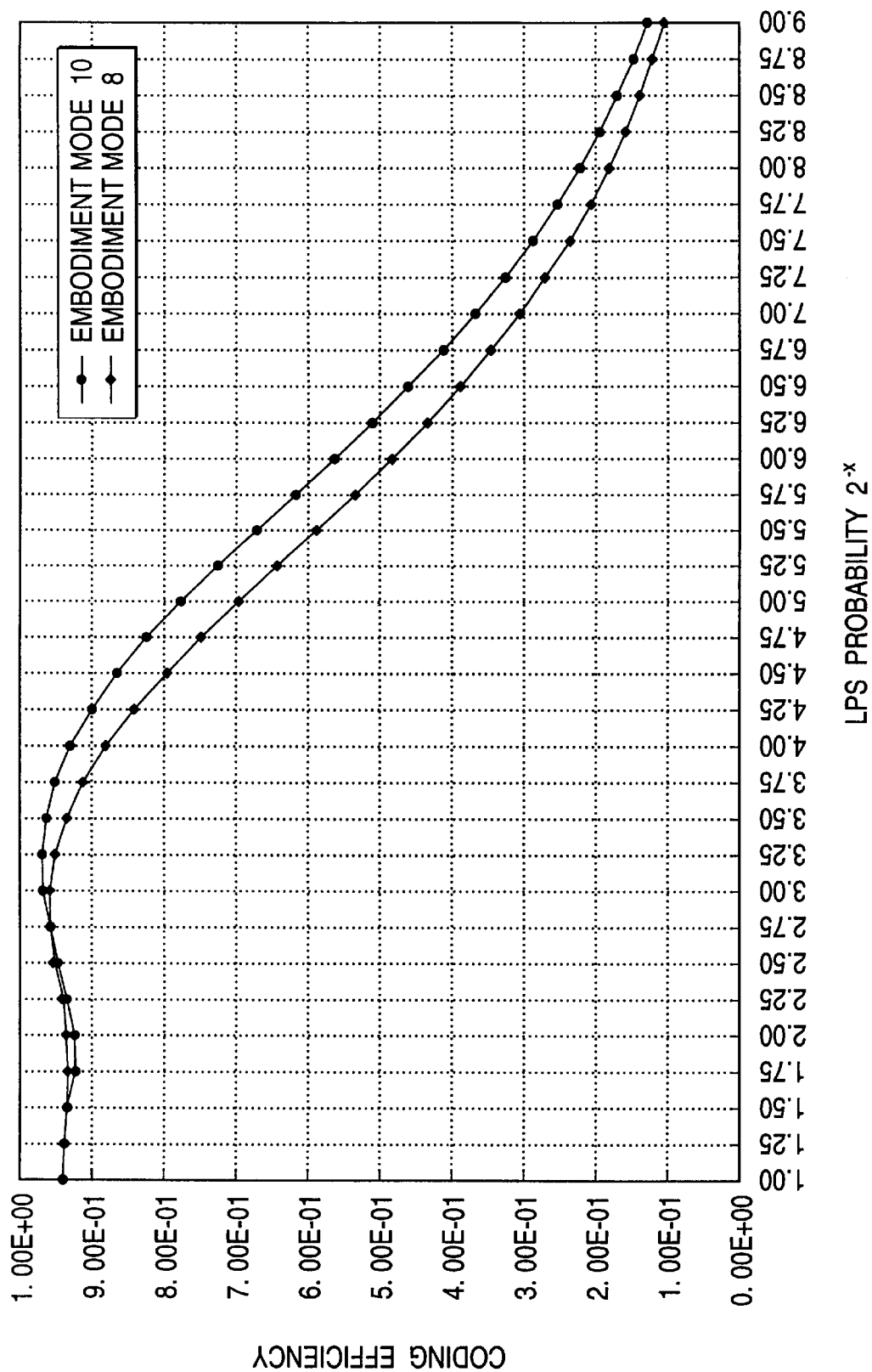
FIG. 37 is a graphic representation for indicating a coding efficiency of the tenth embodiment.

FIG. 37 represents the results capable of increasing the coding efficiency. In FIG. 37, assuming now that the occurrence frequency p0 of the data is constant, the coding efficiency E=H(p0)/LEN was calculated from the entropy H(p0) obtained from the set occurrence probability and also the code length (LEN) obtained from the simulation. As the constant condition of the simulation, similar to embodiment 8, it is set T1=4 (T1 having substantially no meaning), T2=10, T3=8, T4=2. While the occurrence frequency p0 of the data is varied, the respective data lengths are set to 100000. Then, the coding process operation was carried out by a single context.

It should also be understood that even when the arithmetic coding unit is arranged in such a manner that the integer portion also owns the finite precision, the codes are outputted outside in the unit of N bits, for example, 8 bits (1 byte), and the bits sequentially overflowed can be neglected, this arrangement gives no adverse influence to the above-explained effects capable of improving the probability estimating precision and also the coding efficiency irrelevant to the control method for the carry propagate process operation required thereto.

Also, in this arithmetic coding unit, the more probable symbol (MPS) is arranged at the lower portion with respect to the less probable symbol (LPS). Alternatively, this more probable symbol (MPS) may be arranged at the upper portion. With respect to the given binary data, the binary arithmetic coding operation is applied to the arithmetic coding unit. When the multi-value data is given, this binary arithmetic coding operation may be replaced by a multi-value arithmetic coding operation. With respect to the single context, each of the counters and the predicted value are employed as a pair. With respect to a multi-context, plural pairs of the counters and the predicted values may be employed which are identical to a total number of contexts.

Furthermore, this gives no adverse influence to the effect capable of essentially improving the probability estimating precision and the coding efficiency, according to the present invention (embodiment mode), irrelevant to the correction process from the final code value to the minimum effective digit, and the removing process of the code bit 0 subsequent to the terminal.

It should be noted in embodiment 10 that preselected values may be used as the constants T1, T2, T3, and T4.

In the above-described embodiment 7 to embodiment 10, in such a case that the total N TOTAL of the occurrence frequencies of the more probable symbol (MPS) and the less probable symbol (LPS) is counted, there is a possibility that it becomes (N TOTAL=T2+1, N LPS=2) when no counting process operation by the more probable symbol (MPS) is carried out under (N TOTAL=T2, N LPS=1), but the counting process operation is performed since the less probable symbol (LPS) occurs, so that the ½ reduction process operation is executed. In this case, as one example, when the sufficient precision/capacity are not secured in the counter, or the memory, only the less probable symbol (LPS) may be counted to be handled as (N TOTAL=T2, N LPS=2).

In such a case that if the total of the occurrence frequencies of the more probable symbol (MPS)s, or the occurrence frequencies of the more probable symbol (MPS) and also the less probable symbol (LPS) is equal to T2, as well as the occurrence frequency of the less probable symbol (LPS) is equal to 1, then the ½ reduction process operation is brought into the waiting condition, otherwise the counting operation of the more probable symbol (MPS) is not carried out, the ½ reduction process operation is not carried out when the occurrence frequency of the less probable symbol (LPS) becomes larger than, or equal to 2. As a consequence, for instance, even when the respective count values are directly reduced by ½, it can be guaranteed that the count value to be updated does not become 0. Also, all of the calculations of the ½ reduction values are not always equal to each other. For example, in the case of a specific value, e.g., an odd number, and an even number, otherwise in the case that the ½ reduction process operation is done based on the minimum value condition, or the maximum value condition, the individual calculations may be applied.

In summary, a coding method is featured by comprising a step for extracting a context of a supplied signal; an adaptive probability estimating step for estimating probability of the signals supplied from a signal source and the context; a step for encoding entropy so as to produce a replica of the encoded signal in response to the estimated probability upon receipt of the signal from the signal source; and a step for interfacing the encoded replica as an output to a transfer medium. At the adaptive probability estimating step, when the probability is estimated by an occurrence frequency of non-storage information data, preset values are added to the respective counter values, depending on such a fact as to whether such a count value of frequencies smaller than a frequency at which a count value for a certain context becomes a maximum value is equal to an odd number, or an even number, and thereafter the added counter values are reduced by ½.

Also, a coding method is featured by comprising a step for extracting a context of a supplied signal; an adaptive probability estimating step for estimating probability of the signals supplied from a signal source and the context; a step for encoding entropy so as to produce a replica of the encoded signal in response to the estimated probability upon receipt of the signal from the signal source; and a step for interfacing the encoded replica as an output to a transfer medium. At the adaptive probability estimating step, when the probability is estimated by an occurrence frequency of non-storage information data, if the count value is equal to 1 for a frequency smaller than a frequency at which the count value for a certain context becomes the maximum value, then the ½ reduction process operation of the count value is not carried out. Instead, while the count process operations of all of the frequencies for this context are stopped until the count value of the smaller frequency becomes 2, the probability estimated from this value is used as each of the estimated probability values.

Also, a coding method is featured by comprising a step for extracting a context of a supplied signal; an adaptive probability estimating step for estimating probability of the signals supplied from a signal source and the context; a step for encoding entropy so as to produce a replica of the encoded signal in response to the estimated probability upon receipt of the signal from the signal source; and a step for interfacing the encoded replica as an output to a transfer medium. At the adaptive probability estimating step, when the probability is estimated by an occurrence frequency of non-storage information data, in such a case that a count value for a certain context becomes a maximum value, the count value for this context is not directly reduced by ½. Instead, after a value preset by a count value of a smaller frequency has been added to this count value, the added count value is reduced by ½.

Figure 38:
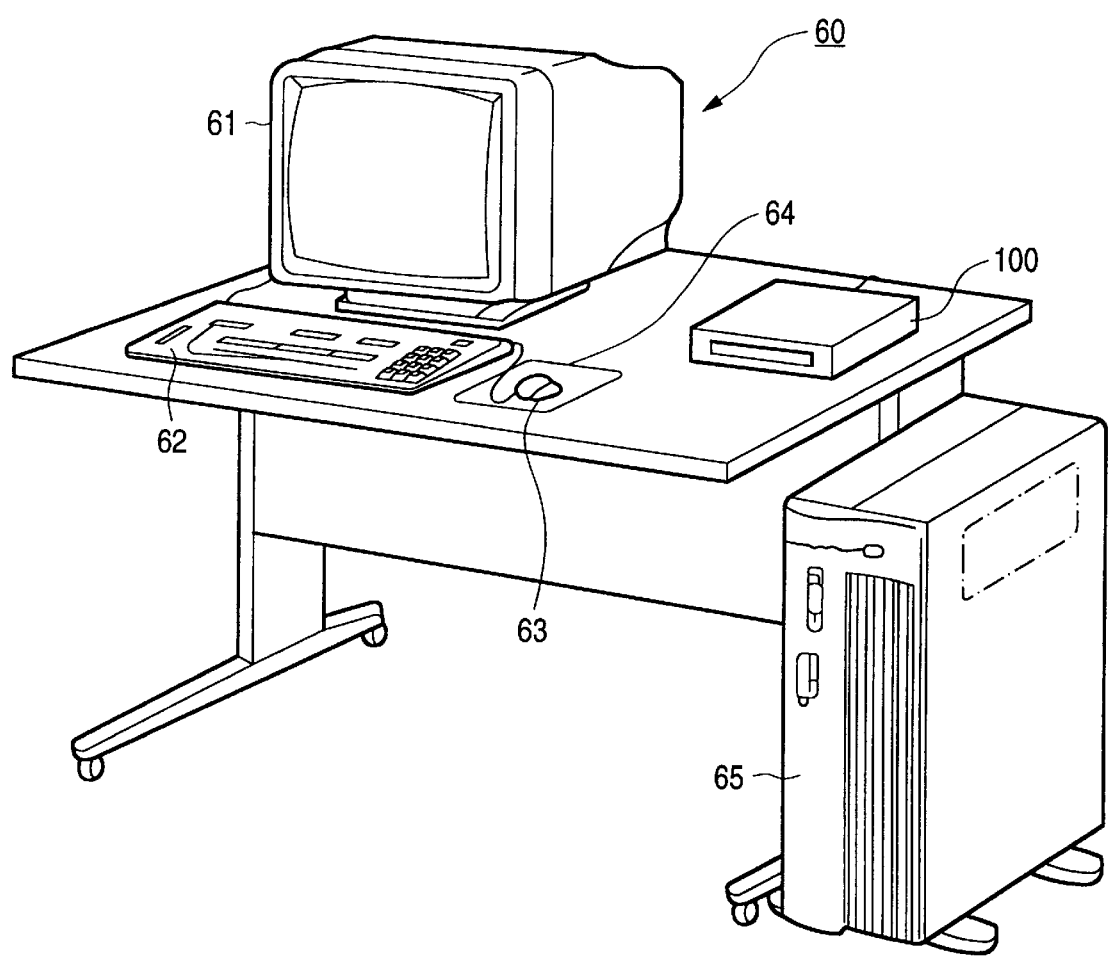
FIG. 38 is a perspective view for showing an image processing apparatus of the embodiment.

FIG. 38 is a perspective view for showing a structural example of an image processing apparatus 60 equipped with the adaptive coding method according to the above-explained embodiments 1 to 10.

In FIG. 38, the image processing apparatus 60 is equipped with a display unit 61, a keyboard 62, a mouse 63, a mouse pad 64, a system unit 65, and a compact disk apparatus 100.

As indicated in FIG. 38, the image processing apparatus according to this embodiment enters thereinto coded image information from the disk apparatus 100 (for instance, such a disk apparatus with using medium such as CD-ROM, FD, MO, PD or ZIP, and decodes this coded image information. Then, this image processing apparatus 60 transfers the decoded image information to the system unit 65 so as to be displayed on the display unit 61. The image processing apparatus 60 according to this embodiment may code image information displayed on the display unit 61 to thereby output this coded image information to the compact disk apparatus 100. Also, this image processing apparatus 60 may code image information and may transfer the coded image information via a line (not shown). However, the arrangement of the image processing apparatus according to this embodiment is not limited to the arrangement of the personal computer, or the workstation as shown in FIG. 38, but may be applied to any types of arrangements with using other components. For example, a video tape player may be employed as the input apparatus, instead of the compact disk apparatus 100. Alternatively, image data acquired from a network may be inputted instead of the above-described image information. Also, the input data may be made in an analog form, or a digital form.

Figure 39:
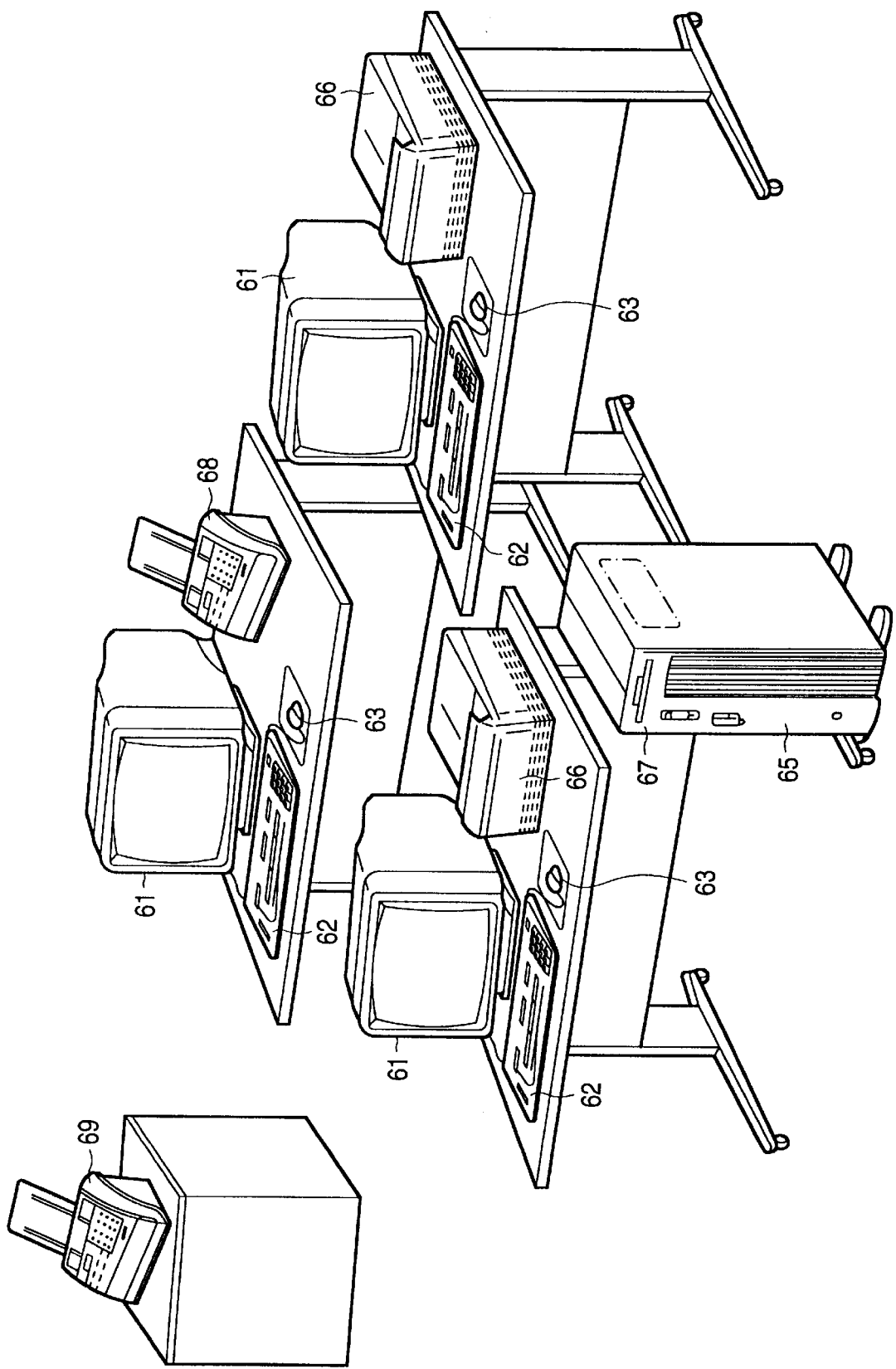
FIG. 39 is a perspective view for representing an application example of the image processing apparatus of the embodiment.

Also, the image processing apparatus of this embodiment may be provided as an independent apparatus, as illustrated in FIG. 38. Alternatively, as shown in FIG. 39, this image processing apparatus may be realized by, as indicated in FIG. 39, peripheral apparatuses such as a printer 66, a scanner 68, a facsimile apparatus 69, a display apparatus (for example, display unit 61), and a storage apparatus (for instance, compact disk apparatus 100).

That is to say, the image processing apparatus of this embodiment implies any electronic appliance equipped with the adaptive coding methods, as previously described in the above-explained embodiments 1 to 10.

Also, the coding apparatus of this embodiment may be realized by employing an independent housing, or by being constituted as a portion of a system board, or a circuit board for a television camera, a measuring machine, and a computer. Alternatively, this coding apparatus may be realized by being constituted as a semiconductor chip. Although not shown in FIG. 39, the respective apparatuses indicated in FIG. 39 may be connected via a local area network (LAN), through which coded information may be transferred. Also, these apparatuses may be connected by employing a broadband network such as an ISDN (Integrated Services Digital Network), through which coded information may be transmitted/received.

Furthermore, the coding apparatus of this embodiment may be realized by using communication networks such as wired networks, radio communication networks, public/private communication lines, and electric/optical signal communication lines, through which coded information is transmitted/received.

As previously described, in accordance with embodiment 1 to embodiment 7, in such a coding method that only the occurrence frequency of data is stored as the variables or the array, in the case that the predicted value is judged from the largest occurrence frequency only by the counter for the respective data values, it is required to previously determine which value should be used as the predicted value when the occurrence frequencies are equal to each other. Also, in such a case that the values are roughly approximated in the calculation of the occurrence probability when the effective digit number is small, the predicted value calculated immediately before is made in correspondent with the larger occurrence probability. As a consequence, since this may be approximated to the occurrence trend of the preset data, the coding efficiency can be increased, as compared with the coding efficiency obtained when the predicted value is fixed.

Since the adaptive coding method according to the present invention has been arranged by employing the above-described process steps, the estimated probability error can be reduced and also the coding efficiency can be increased.

What is claimed is:

1. An adaptive coding method comprising the steps of:
    entering data to be coded to obtain a predicted value and an occurrence probability of a symbol with respect to the entered data as a first step;
    judging whether the entered data with respect to the predicted value is equal to a more probable symbol (MPS), or a less probable symbol (LPS) as a second step;
    calculating a region on a numerical line, which corresponds to the entered data, based upon the occurrence probability obtained by said first step and the judgment result of said second step as a third step;
    counting two occurrence time accumulated values from either the more probable symbol (MPS) or the less probable symbol (LPS) with respect to said entered data as a fourth step;
    comparing at least one of the two occurrence time accumulated values calculated as an occurrence frequency at said fourth step with a preselected value (threshold value), and reducing said at least one of the two occurrence time accumulated values by ½ in the case that said at least one of the two occurrence time accumulated values reach said preselected value (threshold value) as a fifth step; and
    defining said more probable symbol (MPS) and said less probable symbol (LPS) in correspondence with the region on the numerical line with respect to said entered data to output coordinate values on the numerical line as a codeword as a sixth step.

2. The adaptive coding method as claimed in claim 1 wherein:
    at said fourth step, two occurrence time accumulated values of an occurrence frequency (N LPS) of the less probable symbol (LPS), and a total value (N TOTAL) of the occurrence frequencies of the less probable symbol (LPS) and of the more probable symbol (MPS) are counted; and
    at said first step, occurrence probability of symbols is obtained by counting said occurrence time accumulated values (N LPS, N TOTAL).

3. The adaptive coding method as claimed in claim 1 wherein:
    at said fourth step, the at least one of the two occurrence time accumulated values includes an occurrence frequency (N LPS) of the less probable symbol (LPS), and an occurrence frequency (N MPS) of the more probable symbol (MPS); and
    at said first step, occurrence probability of symbols is obtained by counting said occurrence time accumulated values (N LPS, N TOTAL).

4. The adaptive coding method as claimed in claim 1 wherein:
    said fifth step is provided between said first step and said second step.

5. The adaptive coding method as claimed in claim 1 wherein:
    in counting of the occurrence of the more probable symbol (MPS) at said fourth step, in the case that an occurrence time accumulated value M for counting the more probable symbol reaches a set value T2, counting is not updated; and
    in ½ reduction of the two occurrence time accumulated values at said fifth step, in the case that an occurrence time accumulated value m of the less probable symbol reaches a set value T1, or that the occurrence time accumulated value M is the set value T2 or more and the occurrence time accumulated value m is 2 or more, the two occurrence time accumulated values are reduced by ½, respectively.

6. The adaptive coding method as claimed in claim 1 wherein:

in counting of the occurrence of the more probable symbol (MPS) at said fourth step, in the case that an occurrence time accumulated value M for counting the more probable symbol reaches a set value T2, counting is not updated; and in ½ reduction of the two occurrence time accumulated values at said fifth step, in the case that an occurrence time accumulated value m of the less probable symbol reaches a set value T1, that the occurrence time accumulated value m is a set value T4 or more and the occurrence time accumulated value M reaches a set value T3, that the occurrence time accumulated value M is the set value T3 or more and the occurrence time accumulated value m reaches the set value T4, or that the occurrence time accumulated value M is the set value T2 or more and the occurrence time accumulated value m is 2 or more, the two occurrence time accumulated values are reduced by ½, respectively.

7. An adaptive coding method comprising:

counting two occurrence frequency accumulated values from either the most probable symbol (MPS) or the less probable symbol (LPS), comparing the two occurrence frequency accumulated values with a threshold, and reducing the two occurrence frequency accumulated values by ½ when they reach the threshold.

8. An adaptive coding method comprising the steps of:

entering data to be coded to obtain a predicted value and an occurrence probability of a symbol with respect to the entered data as a first step;

comparing two occurrence time accumulated values calculated as an occurrence frequency with a preselected value (threshold value), and reducing said two occurrence time accumulated values by ½ when said two occurrence time accumulated values reach said preselected value (threshold value) as a second step;

judging whether the entered data with respect to the predicted value is equal to a more probable symbol (MPS), or a less probable symbol (LPS) as a third step;

calculating a region on a numerical line, which corresponds to the entered data, based upon the occurrence probability obtained by said first step and the judgment result of said third step as a fourth step;

counting the two occurrence time accumulated values from either the more probable symbol (MPS) or the less probable symbol (LPS) with respect to said entered data as a fifth step; and defining said more probable symbol (MPS) and said less probable symbol (LPS) in correspondence with a region on the numerical line with respect to said entered data to output coordinate values on the numerical line as a codeword as a sixth step.

* * * * *